(12) United States Patent
Sugiyama et al.

(10) Patent No.: US 6,297,545 B1
(45) Date of Patent: Oct. 2, 2001

(54) SEMICONDUCTOR DEVICE

(75) Inventors: Michiaki Sugiyama, Tokyo; Tamaki Wada, Higashimurayama; Masachika Masuda, Tokorozawa, all of (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/563,756

(22) Filed: May 1, 2000

Related U.S. Application Data

(63) Continuation of application No. 09/139,563, filed on Aug. 25, 1998, now Pat. No. 6,153,922.

(30) Foreign Application Priority Data

Aug. 25, 1997 (JP) .................................................. 9-227995
Feb. 27, 1998 (JP) .................................................. 10-46487

(51) Int. Cl.[7] .............................................. H01L 23/495
(52) U.S. Cl. .......................................... 257/666; 257/676
(58) Field of Search .................................. 257/666, 676, 257/691, 783

(56) References Cited

U.S. PATENT DOCUMENTS

| | | |
|---|---|---|
| 5,068,712 | 11/1991 | Murakami et al. . |
| 5,532,189 | 7/1996 | Kiyono . |
| 5,559,366 | 9/1996 | Fogal et al. . |
| 5,576,246 | 11/1996 | Conru et al. . |
| 5,796,158 | 8/1998 | King . |
| 5,834,831 | 11/1998 | Kubota et al. . |
| 6,133,624 | * 10/2000 | Asada . |
| 6,137,159 | * 10/2000 | Tsubosake et al. . |
| 6,148,509 | * 11/2000 | Schoenfeld . |

FOREIGN PATENT DOCUMENTS

| | | |
|---|---|---|
| 2247988 | 3/1992 | (GB) . |
| 2-246125 | 10/1990 | (JP) . |
| 7-147372 | 6/1995 | (JP) . |
| 8-111490 | 4/1996 | (JP) . |
| 8-162594 | 6/1996 | (JP) . |
| 8-213529 | 8/1996 | (JP) . |
| 10125845 | 5/1998 | (JP) . |

* cited by examiner

*Primary Examiner*—Sheila V. Clark
(74) *Attorney, Agent, or Firm*—Antonelli, Terry, Stout & Kraus, LLP

(57) ABSTRACT

In a package of an LOC (Lead On Chip) structure in which inner lead portions are partially arranged over a major face of a semiconductor chip, there is disclosed a technique for thinning the package and speeding up signal transmission.

Specifically, by partially reducing the thicknesses of the signal inner leads arranged over the major face of the semiconductor chip, the thickness of a sealing resin is reduced while ensuring the mechanical strength of the package.

Moreover, the signal inner leads arranged over the major face of the semiconductor chip are arranged at predetermined spacings from the major face of the semiconductor chip. The power supplying inner leads are bonded to the major face of the semiconductor chip, thus providing a package having a reduced parasitic capacitance.

8 Claims, 19 Drawing Sheets

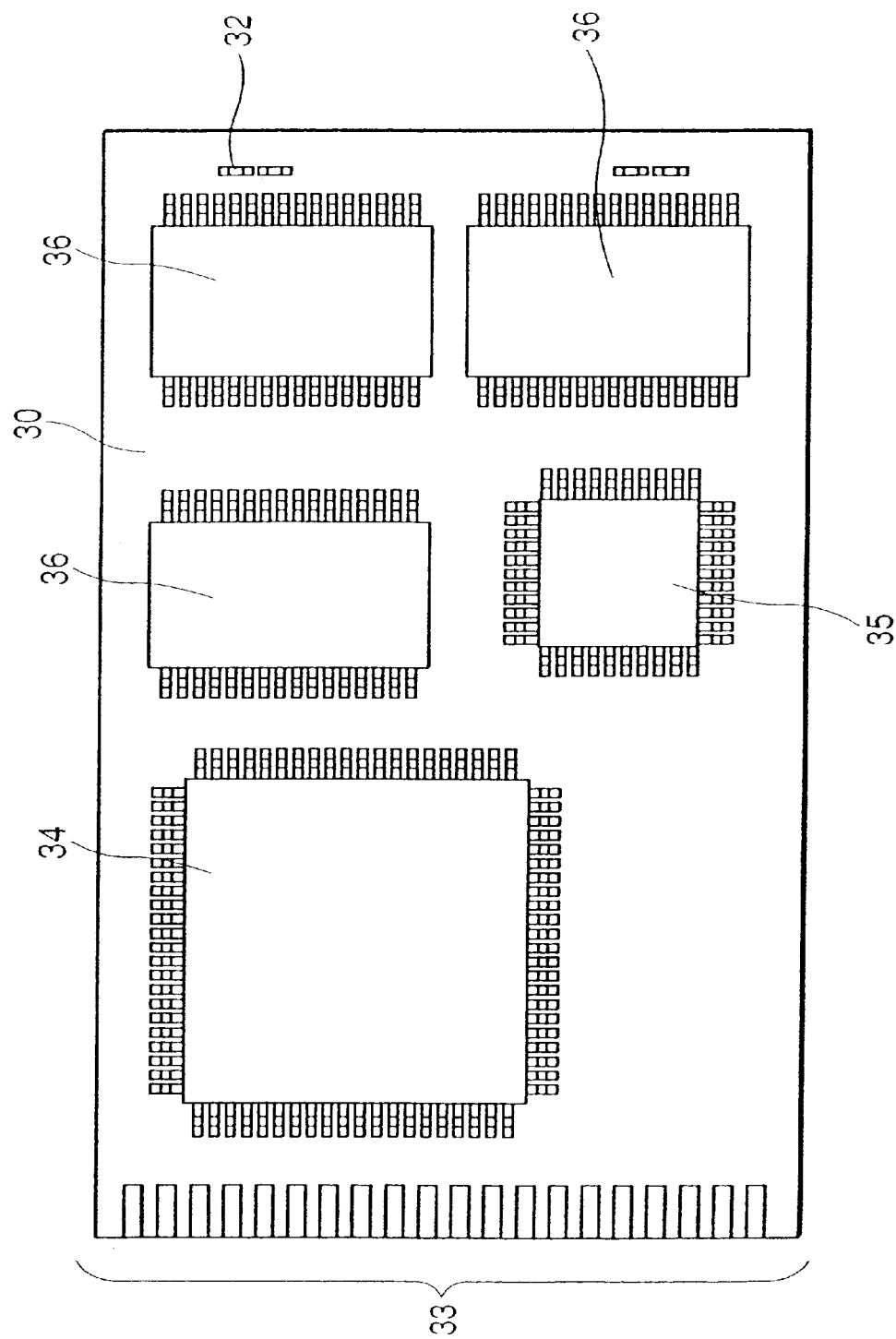

SEMICONDUCTOR DEVICE

CROSS-REFERENCE TO RELATED APPLICATION

This application is a continuation of application Ser. No. 09/139,563, filed on Aug. 25, 1998 now U.S. Pat. No. 6,153,922, the entire disclosure of which is hereby incorporated by reference.

BACKGROUND OF THE INVENTION

The present invention relates to a resin-sealed type semiconductor device having an LOC (Lead On Chip) structure and, more particularly, to a technique which is effective when applied to a thin,small-sized semiconductor package having a TSOP (Thin Small Outline Package) structure or the like.

A typical resin-sealed type semiconductor device having an LOC structure comprises, as shown in FIG. 22 (see Japanese Patent Laid-Open No. 2-246125/1990), for example, a semiconductor chip 1 including a circuit and a plurality of external terminals formed over a major face of a semiconductor substrate; a plurality of leads,each including an inner lead portion 3A comprising inner leads $3A_1$ forming signal inner leads (a first region) and a common inner lead $3A_2$ for supplying a power voltage and a reference voltage (a second region: hereinafter referred to as the bus-bar leads or fixed potential leads), and an outer lead portion 3B formed integrally with the inner lead portions 3A; bonding wires 5 for electrically connecting the external terminals (pads) and the signal inner leads $3A_1$ and the bus-bar leads $3A_2$ of the inner lead portions 3A, respectively; and a sealer 2A for sealing the semiconductor chip 1, the inner lead portions 3A and the bonding wires 5. The signal inner leads $3A_1$ and the bus-bar leads $3A_2$ are arranged over the major face of the semiconductor chip 1, being separated therefrom by an insulating film 4, and the bus-bar leads $3A_2$ are arranged substantially in parallel with the major face of the semiconductor chip 1.

SUMMARY OF THE INVENTION

First, a description will be presented of the items which have not been disclosed in the publicly-known document (Japanese Patent Laid-Open No. 2-246125/1990) and have been investigated by the present inventor.

When a resin-sealed type semiconductor device having an LOC structure, as shown in FIG. 22, is applied as it is to a thin small-sized semiconductor package (TSOP), as shown in FIGS. 23 and 24(a), the entire package becomes thin (e.g., 1.0 mm), so that the resin over the inner leads $3A_1$ accordingly becomes as thin as 0.195 mm. This makes it necessary to set the loop heights of the wires 5 at small values. However, in doing this, the bonding wires 5 and the bus-bar leads $3A_2$ of the signal wires may contact, causing a short circuit, and this problem makes it difficult to reduce the thickness of the resin. When the wire loop heights must be suppressed to low levels, a contrivance in which an insulating coating material 20 is applied to the bus-bar leads $3A_2$ is needed.

Reference will be made to the schematic construction of FIG. 23 (a top plan view of a resin-sealed type semiconductor device having a TSOP structure) and to the examples of FIG. 24(a) to FIG. 24(c) (a section of the device of FIG. 23). In this resin-sealed type semiconductor device having a TSOP structure, to a face of a semiconductor substrate of a semiconductor chip 1 (hereinafter referred to as the "major face of the semiconductor chip 1"), where a circuit and a plurality of external terminals are formed, inner lead portions 3A, which include a plurality of signal line inner leads 3A, and the bus-bar leads $3A_2$, which have an insulating coating material 20 applied to their upper faces, are fixed through the insulating film 4. The inner lead portions 3A and the outer lead portions 3B are formed integrally to constitute leads 3.

As shown in FIGS. 23 and FIGS. 24(a) to 24(c), the signal line inner leads $3A_1$ and the bus-bar leads $3A_2$, which have the insulating coating material 20 applied to their upper faces, of the inner lead portions 3A, are arranged over the major face of the semiconductor chip 1 and are spaced therefrom by the insulating film 4, and the bus-bar leads $3A_2$ are arranged substantially in parallel with the major face of the semiconductor chip 1.

The plurality of signal inner leads $3A_1$, the bus-bar leads $3A_2$ and the semiconductor chip 1 are electrically connected through the bonding wires 5 and are sealed with a mold resin (the sealing body) 2A. The thin type package 2 thus sealed is shaped by cutting the suspension leads (chip supporting leads) 3C and the outer lead portions 3B from the lead frame.

In a thin small-sized semiconductor package with a TSOP structure), which has been investigated by the present inventor, the mold resin 2A over the semiconductor chip 1 is thin, as shown in FIG. 24(a), so that problems arise, such as an appearance defect in which the bonding wires 5,such as Au wires,are seen through the upper face of the package, and a problem of exposure of the wire themselves to the outside. If this thickness is made even smaller (to about 0.5 mm), as shown in FIG. 24(b), the appearance defect and the wire exposure problem become more critical.

Another problem is that when the mold resin (the sealing body) 2A over the major face of the semiconductor chip is thin, cracks are likely to occur, thereby deteriorating the reliability.

In order to lower the wire loops, as shown in FIG. 24(c), it is conceivable to eliminate the insulating tape 4 and to fix the signal inner leads $3A_1$ and the bus-bar leads $3A_2$ to the major face of the semiconductor chip 1 directly with an adhesive. If the distances (spacings) between the major face of the semiconductor chip 1 and the signal inner leads $3A_1$ become short, however, the parasitic capacitance between the major face of the semiconductor chip 1 and the signal inner leads $3A_1$ increases to create a problem wherein the electric characteristics may become deteriorated.

An object of the invention is to provide a technique which is capable of thinning the semiconductor package without causing deterioration of the electric characteristics thereof.

Another object of the invention is to provide a technique which is capable of suppressing the parasitic capacitance between the major face of the semiconductor chip and the leads even if the semiconductor package is thinned.

Another object of the invention is to provide a technique which is capable of ensuring a proper thickness of the sealer over the semiconductor chip of the semiconductor package even if the overall thickness of the semiconductor package is reduced.

Another object of the invention is to provide a technique which is capable of balancing the quantities of the upper and lower sealers of the semiconductor chip even if the overall thickness of the semiconductor package is reduced.

The foregoing and other objects and novel features of the invention will become apparent from the following description to be made with reference to the accompanying drawings.

of the features to be disclosed herein. representative ones will be briefly summarized in the following.

(1) A semiconductor device has a semiconductor chip including a circuit and a plurality of external terminals formed over a major face of a semiconductor substrate, a plurality of leads each including an inner lead portion and an outer lead portion formed integrally with the inner lead portion, bonding wires electrically connecting the external terminals and the inner lead portions, respectively, and a sealing body for sealing the semiconductor chip, the inner lead portions and the bonding wires, wherein the inner lead portions are arranged over the major face of the semiconductor chip at predetermined spacings between the major face and the inner leads, and the portions of the inner leads arranged over the major face are thinner than the other portions of the inner leads.

(2) In a resin-sealed type semiconductor device according to the aforementioned paragraph (1), the portions, arranged over the major face of the semiconductor chip, of the inner lead portions are fixed at their leading end portions to the major face of the semiconductor chip through an insulating film.

(3) In a resin-sealed type semiconductor device according to the aforementioned paragraph (1), the portions arranged over the major face of the semiconductor chip, of the inner lead portions are fixed at their leading end portions to the major face of the semiconductor chip directly with an adhesive.

(4) A semiconductor device has a semiconductor chip including a circuit and a plurality of external terminals formed over a major face of a semiconductor substrate, a plurality of leads each including an inner lead portion having a first region, and an inner lead portion having a second region and an outer lead portion formed integrally with the inner lead portions,bonding wires electrically connecting the external terminals and the first regions and the second regions of the inner lead portions, respectively, and a sealing body for sealing the semiconductor chip, the inner lead portions and the bonding wires, wherein the first regions and the second regions of the inner lead portions are arranged over the major face of the semiconductor chip, wherein the first regions of the inner lead portions are arranged at predetermined spacings between the major face and the inner leads, wherein the portions of the inner leads arranged over the major face are thinner than the other portions of the inner leads, and wherein the inner leads arranged over the major face are fixed at their leading end portions to the major face of the semiconductor chip through an insulating film.

(5) In a resin-sealed type semiconductor device according to the aforementioned paragraph (4), the semiconductor chip is rectangular, the second regions of the inner lead portions have portions arranged substantially in parallel with the long sides of the semiconductor chip, and the parallel-arranged portions are arranged between the external terminals and the leading end portions of the inner leads.

(6) A semiconductor device has a semiconductor chip including a circuit and a plurality of external terminals formed over a major face of a semiconductor substrate, a plurality of leads each including an inner lead portion having a first region, and an inner lead portion having a second region and an outer lead portion formed integrally with the inner lead portions, bonding wires electrically connecting the external terminals and the first regions and the second regions of the inner lead portions, respectively, and a sealing body for sealing the semiconductor chip, the inner lead portions and the bonding wires, wherein the first regions and the second regions of the inner lead portions are arranged over the major face of the semiconductor chip, wherein the first regions of the inner lead portions are arranged at predetermined spacings between the major face and the inner leads, and wherein the portions of the inner leads arranged over the major face are thinner than the other portions of the inner leads and are not fixed at their leading end portions to the major face of the semiconductor chip.

(7) In a resin-sealed type semiconductor device according to the aforementioned paragraphs (4) or (6), the first regions of the inner lead portions are signal leads, whereas the second regions are fixed potential leads.

(8) A semiconductor device has a semiconductor chip including an integrated circuit and a plurality of external terminals formed over a major face of the semiconductor chip, a plurality of leads each including an inner lead portion and an outer lead portion formed integrally with the inner lead portion, portions of the inner lead portions being arranged over the major face of the semiconductor chip and being electrically connected to the corresponding external terminals, and a resin member for sealing the inner lead portions of the plurality of leads and the semiconductor chip, wherein the inner lead portions each include a first surface on the major face side of the semiconductor chip, a second surface on the opposite side to the first surface, a first portion positioned over the major face of the semiconductor chip, and a second portion formed integrally with the first portion and positioned outside the major face of the semiconductor chip, wherein the first portions of the inner lead portions are made thinner than the second portions in the thickness direction of the semiconductor chip, and wherein the first surfaces of the first portions of the inner lead portions are more spaced farther from the semiconductor chip in the thickness direction of the semiconductor chip than the first surfaces of the second portions of the inner lead portions.

(9) In a resin-sealed type semiconductor device according to the aforementioned paragraph (8), the first portions of the inner lead portions are bonded to the major face of the semiconductor chip through an insulating film.

(10) In a resin-sealed type semiconductor device according to the aforementioned paragraph (8), the first portions of the inner lead portions are bonded to the major face of the semiconductor chip through an adhesive.

(11) In a resin-sealed type semiconductor device according to the aforementioned paragraph (8), the inner lead portions and the corresponding external terminals are connected through wires.

(12) In a resin-sealed type semiconductor device according to the aforementioned paragraph (11), the plurality of leads include signal leads and fixed potential leads, the inner lead portions of the fixed potential leads are partially arranged over the major face of the semiconductor chip between the plurality of external terminals of the leading ends of the inner lead portions of the signal leads, and the wires electrically connecting the inner lead portions of the signal leads and the corresponding external terminals are so arranged as to cross over portions of the inner lead portions of the fixed potential leads.

(13) A semiconductor device has a semiconductor chip including an integrated circuit and a plurality of external terminals formed over a major face of the semiconductor chip, a plurality of signal leads each including an inner lead portion and an outer lead portion formed integrally with the inner lead portion, portions of the inner lead portions being arranged over the major face of the semiconductor chip and being electrically connected to the corresponding external terminals through wires, fixed potential leads each including an inner lead portion and an outer lead portion formed integrally with the inner lead portions, the inner lead portions being partially arranged over the major face of the semiconductor chip and being electrically connected to the corresponding external terminals, and a resin member for sealing the inner lead portions of the plurality of signal leads, the inner lead portions of the fixed potential leads, and the semiconductor chip, wherein the inner lead portions of the signal leads each include a first surface on the major face side of the semiconductor chip, a second surface on the opposite side to the first surface, a first portion positioned over the major face of the semiconductor chip, and a second portion formed integrally with the first portions and positioned outside the major face of the semiconductor chip, wherein the first portions of the inner lead portions of the signal leads are made thinner than the second portions in the thickness direction of the semiconductor chip, wherein the first surfaces of the first portions of the inner lead portions the signal leads are spaced farther from the semiconductor chip in the thickness direction of the semiconductor chip than the first surfaces of the second portions of the inner lead portions, wherein the inner lead portions of the fixed potential leads are partially arranged over the major face of the semiconductor chip between the leading ends of the inner lead portions of the signal leads and the plurality of external terminals, and wherein the inner lead portions of the fixed potential leads are partially arranged lower in the thickness direction of the semiconductor chip than the leading ends of the inner lead portions of the signal leads.

(14) In a resin-sealed type semiconductor device according to the aforementioned paragraph (13), the inner lead portions of the fixed potential leads are partially bonded to the major face of the semiconductor chip with an adhesive, and the inner lead portions of the signal leads are spaced at their leading ends from the major face of the semiconductor chip.

(15) In a resin-sealed type semiconductor device according to the aforementioned paragraph (13), the inner lead portions of the signal leads are bonded at their leading ends to the major face of the semiconductor chip through an insulating film.

(16) In a resin-sealed type semiconductor device according to the aforementioned paragraph (13), the wires electrically connecting the inner lead portions of the signal leads and the corresponding external terminals are so arranged as to cross over portions of the inner lead portions of the fixed potential leads.

(17) A semiconductor device has a semiconductor chip including an integrated circuit and a plurality of external terminals formed over a major face of the semiconductor chip, a plurality of signal leads each including an inner lead portion and an outer lead portion formed integrally with the inner lead portions, portions of the inner lead portions being arranged over the major face of the semiconductor chip and being electrically connected to the corresponding external terminals through wires, fixed potential leads each including an inner lead portion and an outer lead portion formed integrally with the inner lead portion, the inner lead portions being partially arranged over the major face of the semiconductor chip and being electrically connected to the corresponding external terminals, and a resin member for sealing the inner lead portions of the plurality of signal leads, the inner lead portions of the fixed potential leads, and the semiconductor chip, wherein the inner lead portions of the signal leads each includes a first surface on the major face side of the semiconductor chip, a second surface on the opposite side to the first surface, a first portion positioned over the major face of the semiconductor chip, and a second portion formed integrally with the first portion and positioned outside the major face of the semiconductor chip, wherein the first portions of the inner lead portions of the signal leads are made thinner than the second portions in the thickness direction of the semiconductor chip, wherein the first portions of the inner lead portions of the signal leads have leading end portions to be connected to the wires, wherein the first surfaces of the first portions of the inner lead portions of the signal leads other than the leading end portions are spaced farther from the semiconductor chip in the thickness direction of the semiconductor chip than the first surfaces of the second portions of the inner lead portions, wherein the first portions of the inner lead portions of the signal leads are arranged lower in the thickness direction of the semiconductor chip than the first portions of the inner lead portions of the signal leads other than the leading end portions, wherein the inner lead portions of the fixed potential leads are partially arranged over the major face of the semiconductor chip between the leading end portions of the first portions of the inner lead portions of the signal leads and the plurality of external terminals, and wherein the inner lead portions of the fixed potential leads are partially arranged lower in the thickness direction of the semiconductor chip than the first portions of the inner lead portions of the signal leads other than the leading end portions.

(18) In a resin-sealed type semiconductor device according to the aforementioned paragraph (17), portions of the inner lead portions of the fixed potential leads and the leading end portions of the inner lead portions of the signal leads are bonded to the major face of the semiconductor chip with an adhesive.

(19) In a resin-sealed type semiconductor device according to the aforementioned paragraph (17) the wires connecting the inner lead portions of the signal leads and the corresponding external terminals are so arranged as to cross over portions of the inner lead portions of the fixed potential leads.

BRIEF DESCRIPTION OF THE DRAWINGS

FIGS. 20(a) and 20(b) are schematic top and bottom plan views, respectively,. showing the construction of an electronic device of Embodiment 7 of the invention;

DESCRIPTION OF THE PREFERRED EMBODIMENTS

Figure 1:
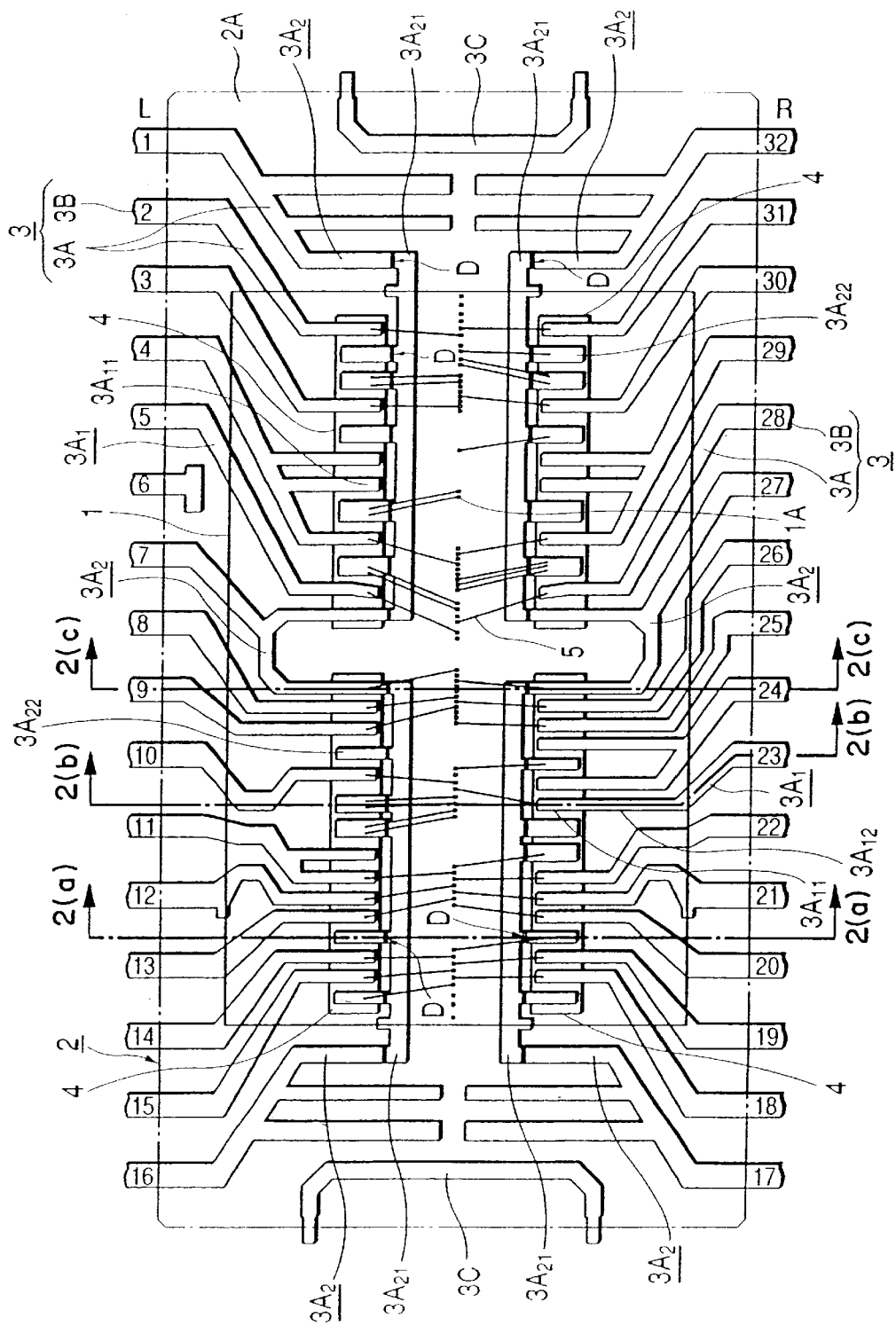
FIG. 1 is a schematic top plan view showing the construction of a resin-sealed type semiconductor device of Embodiment 1 of the invention.

The invention will be described in detail in connection with various embodiments with reference to the accompanying drawings.

Throughout all the drawings for explaining the features of the invention, those portions having identical functions are designated by identical reference numerals, and their repeated description will be omitted.

Embodiment 1

Figure 2A:
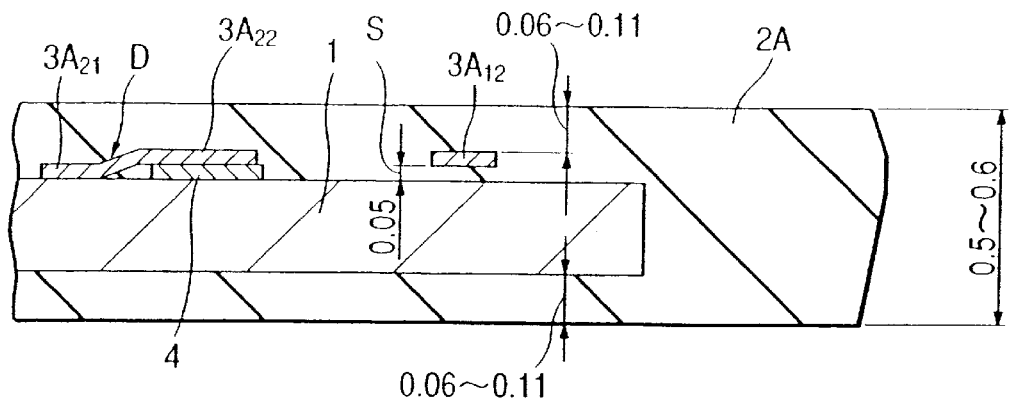
FIGS. 2(a) to 2(c) are sections taken along lines A–A', B–B' and C–C' in FIG. 1, respectively.
Figure 2B:
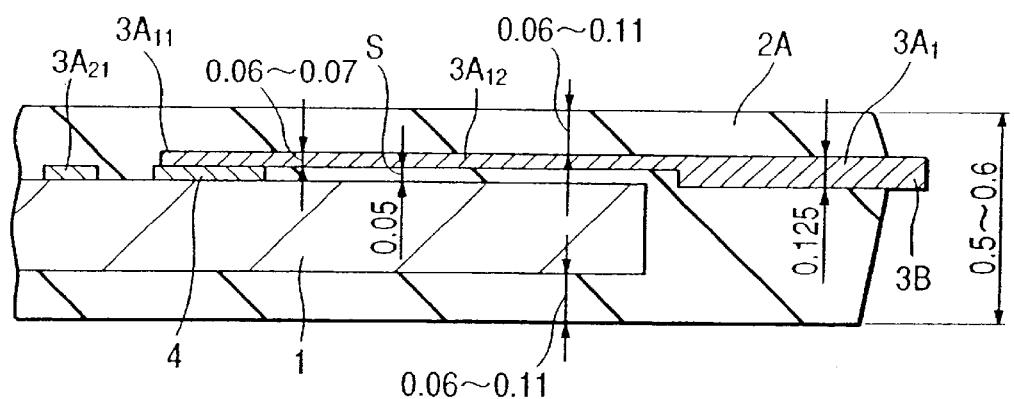
Figure 2C:
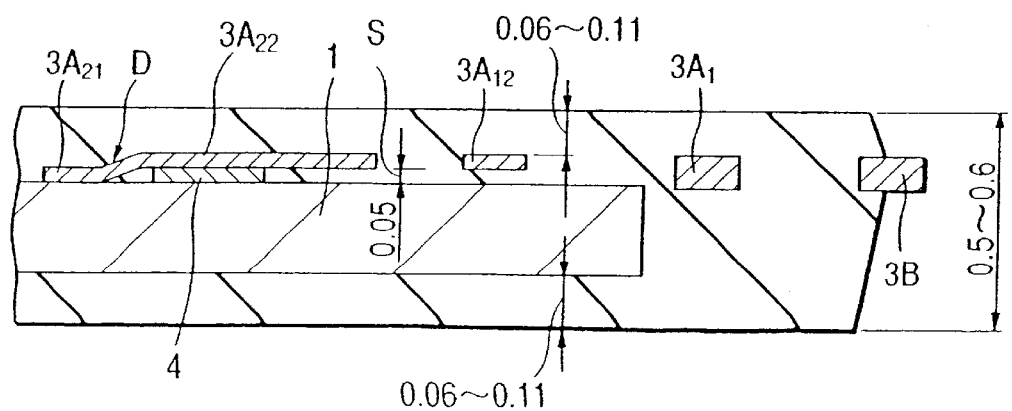

FIG. 1 is a schematic top plan view showing the construction of a resin-sealed type semiconductor device representing Embodiment 1 of the invention; FIG. 2(a) is a section taken along line A–A' of FIG. 1; FIG. 2(b) is a section taken along line B–B' of FIG. 1; and FIG. 2(c) is a section taken along line C–C' of FIG. 1.

Throughout all the embodiments of the invention, the semiconductor chip is sealed in a resin-sealed type package having a TSOP structure. The resin-sealed type package of this kind adopts an LOC (Lead On Chip) structure in which inner lead portions 3A are arranged over a rectangular semiconductor chip 1, as shown in FIG. 1.

The inner lead portions 3A are integral at their outer ends with outer lead portions 3B. Signals applied to the outer lead portions 3B conform to the standards individually and the outer lead portions 3B are correspondingly numbered. In FIG. 1, the upper lefthand end is the 1st terminal, and the lower lefthand end is the 16th terminal. The lower righthand end is the 17th terminal, and the upper righthand end is the 32th terminal. In short, the package of the present TSOP structure has 32 terminals.

The 1st, 7th and 16th terminals are for the power voltage Vcc,such as the operating voltage of 5 volts (V) or 3 volts (V) of the circuit. The 17th, 27th and 32nd terminals are for the reference voltage Vss of 0 volts (V), for example.

The inner lead portions 3A each includes, as shown in FIGS. 1 and 2(a) to 2(c), a plurality of signal line inner leads (first regions) $3A_1$ and two bus-bar leads (second regions) $3A_2$. The bus-bar leads are leads for feeding the power voltage and the reference voltage to the semiconductor chip and will also be referred to as the "fixed potential leads".

The plurality of signal line inner leads $3A_1$ are extended across the individual long sides of the rectangule of the semiconductor chip 1 to the center region of the semiconductor chip 1.

The signal line inner leads (the first regions) $3A_1$ are arranged, as shown in FIG. 2(b), over the major face (the major face of the semiconductor substrate, over which the circuit and a plurality of external terminals are formed) of the semiconductor chip 1, at predetermined spacings S (predetermined distances) between the major face and inner leads $3A_{12}$, which are made thinner than the other portions of the inner leads $3A_1$.

The leading end portions $3A_{11}$ of the thinned signal line inner leads (the first regions) $3A_{12}$ are fixed to the major face of the semiconductor chip 1 through an insulating film 4, as shown in FIG. 1 and FIGS. 2(b) and 2(c).

The individual leading end portions $3A_{11}$ of the plurality of signal line inner leads $3A_1$ are individually connected through bonding wires 5 to bonding pads (the external terminals) 1A arrayed at the central portion of the semiconductor chip 1.

The two bus-bar leads $3A_2$ are formed over the major face of the semiconductor chip 1, as shown in FIG. 1, each include portions $3A_{21}$ arranged substantially in parallel with the long sides of the chip 1, and projections $3A_{22}$ arranged substantially in parallel with the short sides of the chip 1 and having regions to which the bonding wires 5 are bonded, and are made integrally of the same material. At the portions $3A_{21}$ of the bus-bar leads $3A_2$, the projections $3A_{22}$ are made integral with the portions $3A_{21}$ at a plurality of predetermined positions. These projections $3A_{22}$ are fixed with the insulating film 4. The portions $3A_{21}$ are so arranged Lo be low by forming steps D so as to be closer lo the major face of the chip I than the projections $3A_{22}$. By means of the steps, it is possible to prevent the bus-bars and the wires 5 for the signal leads from contacting. The object of bonding the wires 5 to the projections $3A_{22}$ is to make uniform the lengths, bondability and electric characteristics of the wires uniform.

The leading end portions $3A_{11}$ of the signal inner leads $3A_{12}$ and the bonding pads 1A of the semiconductor chip 1, and the projections $3A_{22}$ formed at the parallel portions $3A_{21}$ of the bus-bar leads $3A_2$ and the bonding pads 1A of the semiconductor chip 1, are bonded respectively by the bonding wires 5 and are electrically connected. The semiconductor chip 1, the inner lead portions 3A and the bonding wires 5 are sealed with a mold resin (sealing body) 2A. A package 2 having this sealed TSOP structure is shaped by cutting suspension leads (chip supporting leads) 3C and the outer lead portions 3B from the lead frame. In this embodiment, the portions $3A_{21}$ are close to the chip major face, but are not bonded with adhesive or the like. The insulating tape 4 has a structure in which an epoxy or polyimide adhesive is applied to both sides of a base made of a polyimide resin.

The bonding wires 5 may be gold wires. The method of forming the wires 5 may be the nail head bonding method or the ultrasonic thermocompression bonding method. These gold wires may be replaced by aluminum wires, copper wires or coated wires which are prepared by coating the surfaces of metal wires with an insulating resin.

The dimensions of the resin sealed type semiconductor device of Embodiment 1 are shown in FIG. 2(a) to FIG. 2(c) (the unit is a millimeter: mm), wherein the thickness of the resin-sealed type semiconductor device is 0.5 to 0.6 mm, the thickness of the mold resin (the sealing body) over the inner lead portions 3A on the major face of the semiconductor chip 1 is 0.06 to 0.11 mm, the thickness of the sealer 2A below the face opposed to the major face of the semiconductor chip 1 is 0.06 to 0.11 mm, and the thickness of the sealer 2A over the crests of the bonding wires 5 is 0.07 mm or more (the minimum value is 0.07 mm).

The thickness of the semiconductor chip 1 is 0.2 to 0.28 mm; the thickness of the portions $3A_{21}$, arranged over the major face of the semiconductor chip 1, of the bus-bar leads $3A_2$ is 0.06 to 0.07 mm; the thickness of the signal inner leads $3A_{12}$ is 0.06 to 0.07 mm; the thickness of the insulating film 4 is 0.05 mm; and the thicknesses of the inner lead portions 3A and the outer lead portions 3B are individually about 0.125 mm.

Next the assembling steps for arranging the inner lead portions 3A over the major face of the semiconductor chip 1 will be described.

Assembling Steps:
① : Preparing a flat frame which includes the inner lead portions 3A having the plurality of signal line inner leads $3A_1$ and the two bus-bar leads $3A_2$, and the outer lead portions 3B integrated with the inner lead portions 3A;
② : sticking the insulating tape 4 to the plurality of signal line inner leads $3A_1$ of the inner lead portions 3A, and shaping the two bus-bar leads $3A_2$ to form the steps D;
③ : Positioning the lead frame over the semiconductor chip 1 in such a way that the plurality of signal line inner leads 3Al are extended across the individual long sides of the rectangle of the semiconductor chip 1 and to the center side of the semiconductor chip 1 (see FIGS. 1 and 2); and
④ : After this positioning, performing a heat treatment (at 400° C. for 1 sec.) so as to bond the major face of the semiconductor chip 1 and the lead frame through the insulating tape.

A description will be provided later of the method of making the inner leads $3A_{12}$ thinner than the other portions of the inner leads $3A_1$. The steps of the leads may be formed before the tape is stuck. The insulating tape 4 is given a structure in which a thermoplastic polyimide adhesive having a thickness of 0.015 mm is applied to both sides of a thermoplastic polyimide tape having a thickness of 0.03 mm, the adhesive having a thickness of about 0.05 mm as a whole.

Figure 24A:
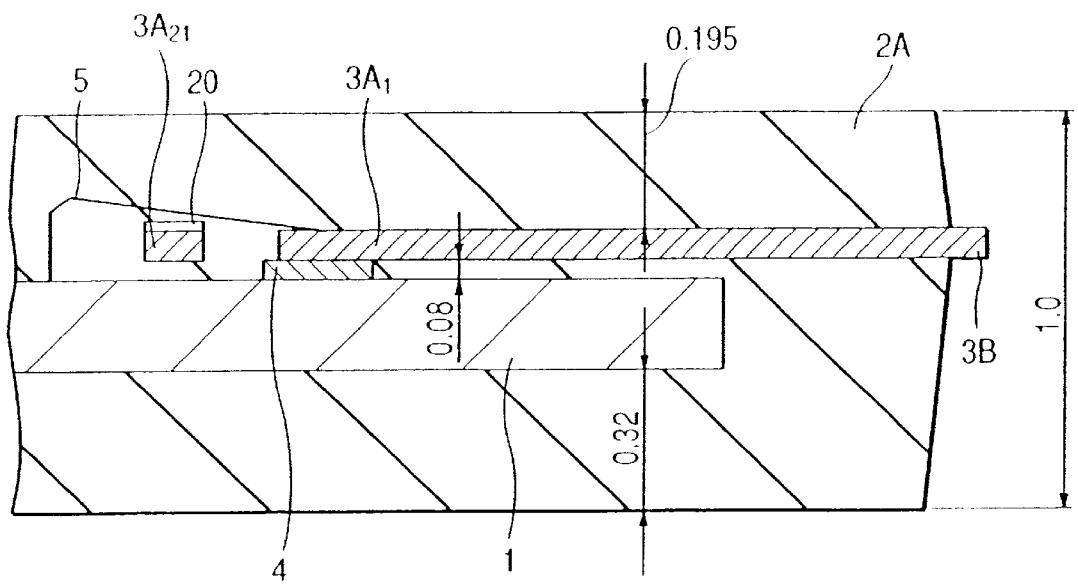
FIGS. 24(a), 24(b) and 24(c) are is a section taken along line A–A' in FIG. 23.
Figure 24B:
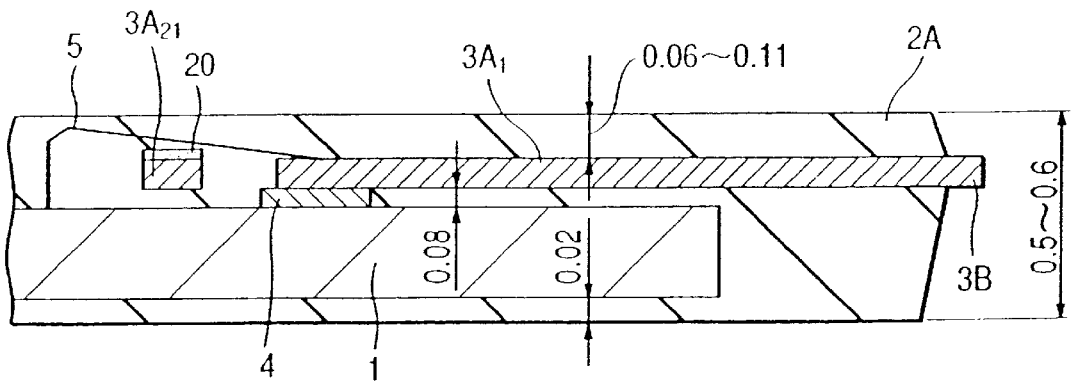
Figure 24C:
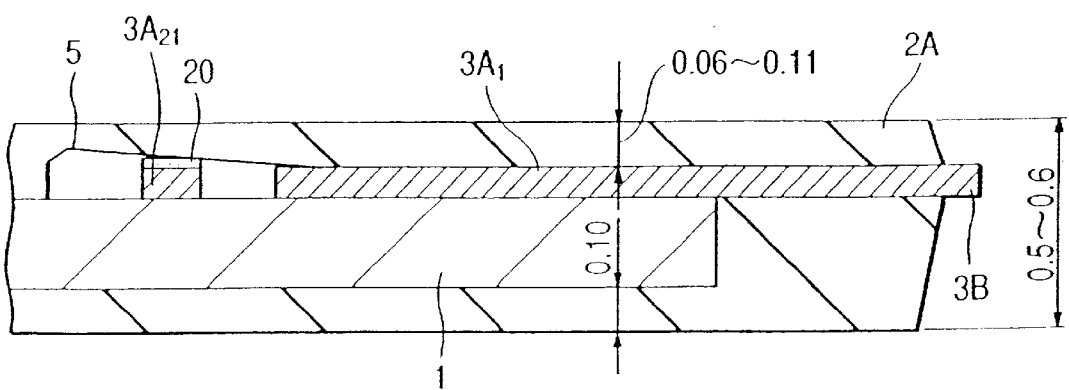

In the resin-sealed type semiconductor having the TSOP structure shown in FIG. 24(a), the thickness of the resin-sealed type semiconductor device is 1.0 mm; the thickness of the mold resin (the sealing body) over the inner lead portion 3A is 0.06 to 0.11 mm; the thickness of the mold resin (the sealing body) below the face, opposed to the major face, of the semiconductor chip 1 is 0.32 mm; the thickness of the mold resin (the sealing body) 2A over the crests of the bonding wires 5 is 0.07 mm or more (the minimum value is 0.07 mm); the thickness of the semiconductor chip 1 is 0.28 mm; the thickness of the bus-bar leads $3A_2$ is 0.125 mm; the individual thicknesses of the signal inner leads $3A_1$ and the outer leads 3B are 0.125 mm; and the thickness of the insulating film 4 is 0.08 mm.

In Embodiment 1, as seen from FIGS. 2(a) to 2(c) and 24(a), over the major face of the semiconductor chip 1, predetermined spacings S are provided between the major face and the inner leads $3A_{12}$, which are made thinner than the other portions of the inner leads $3A_1$. As a result, the semiconductor package 2 can be made thin without causing short-circuit between the bonding wires 5 of the signal lines and the bus-bar leads $3A_2$, even if an insulating coating material 20 is not applied to the bus-bar leads $3A_{21}$. Since the upper faces of the inner leads $3A_{11}$ to which the wires are connected can be lowered, moreover, the heights of the wire loops can be lowered to reduce the thickness of the package. The thickness of the outer leads is made greater than that of the inner leads $3A_{12}$ in such a way as to provide a sufficient mechanical strength, strong enough to prevent deformation of the leads, as might otherwise be caused by an undesired external force applied from the outside of the package, and to support the weight of the package, when the package is surface-mounted. Consequently, the reliability of the package can be improved.

Even if the semiconductor package 2 is made thin, moreover, the parasitic capacitance can be reduced to speed up the operation of the resin-sealed type semiconductor device by providing predetermined spacings S through the insulating film 4 (the thickness is 0.05 mm) between the major face of the semiconductor chip 1 and the inner lead portions 3A.

Even if the semiconductor package 2 is made thin, moreover, it is possible to ensure a proper thickness (about 0.06 to 0.11 mm) of the sealer over the major face of the semiconductor chip 1 of the semiconductor package 2.

By making the inner leads $3A_{,2}$ thinner than the other portions of the inner leads $3A_1$, moreover, the sealers over and under the semiconductor chip 1 can be balanced in quantity by bringing the projections of the outer lead portions 3B closer to the central portion in the thickness direction of the semiconductor package 2, even though the thickness of this semiconductor package 2 has been reduced. This makes it possible to prevent the semiconductor package 2 from being warped because of thermal expansion. At this time, it is preferable that the lower faces of the inner leads $3A_1$, not arranged over the chip 1, be positioned below the major face of the semiconductor chip 1.

In Embodiment 1, moreover, in place of the insulating film 4, adhesive may be employed to bond the leading end portions $3A_{11}$ of the inner leads to the major face of the chip. Though the parasitic capacitance between the chip and the leads increases, the leading end portions $3A_{11}$ can be lower by the thickness of the base of the insulating film 4, so that the wire loops can be lowered. As a result, it is possible to reduce the thickness the package as a whole. This package is suited especially for devices, such as flash memories, whose operating speeds do not need to be relatively high.

Embodiment 2

Figure 3:
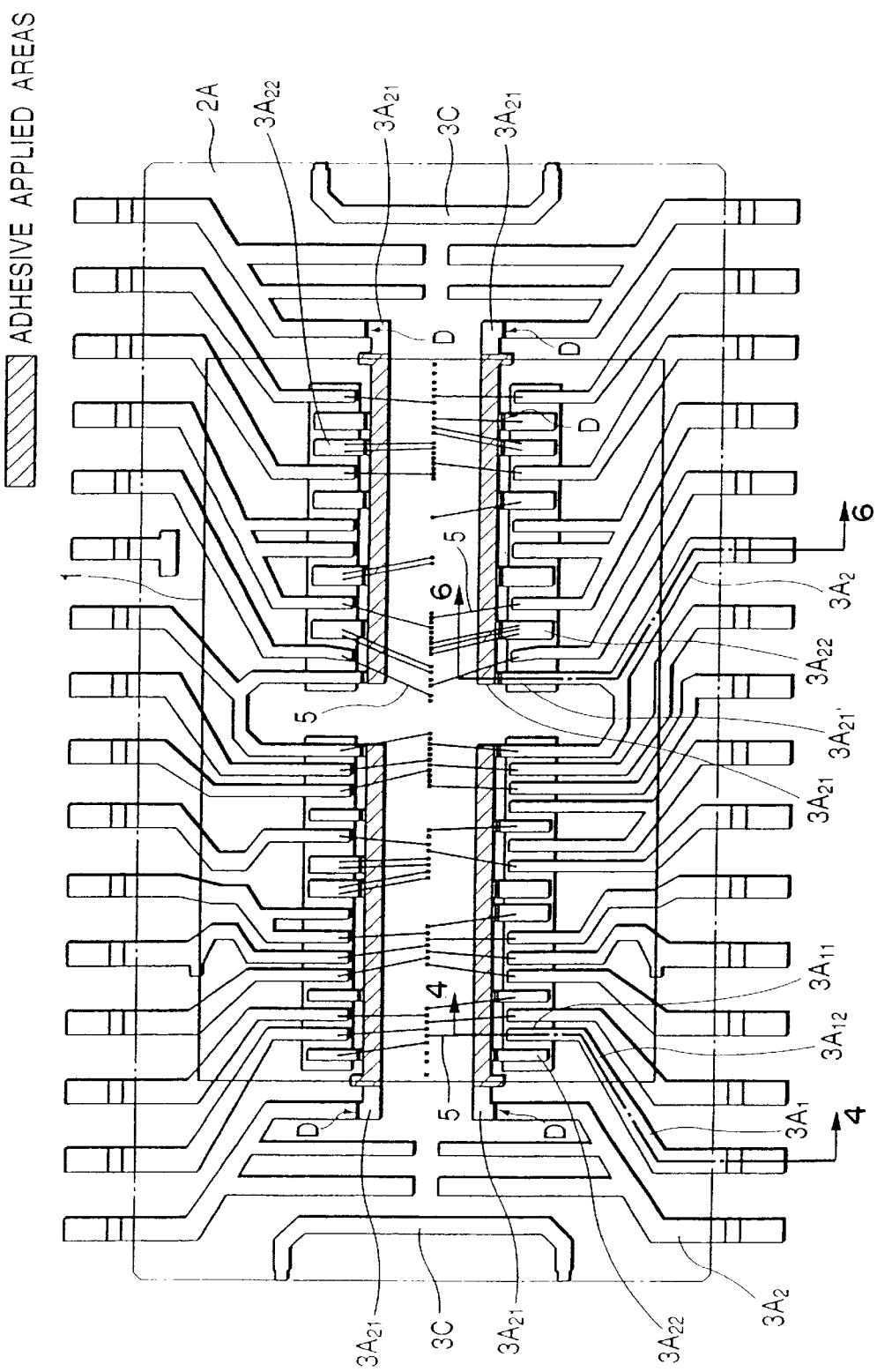
FIG. 3 is a schematic top plan view showing the construction of a resin-sealed type semiconductor device of Embodiment 2 of the invention.
Figure 4:
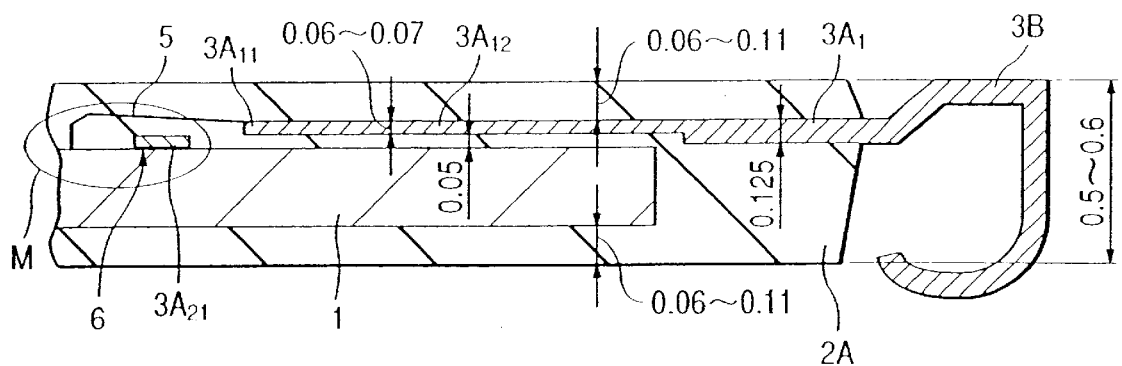
FIG. 4 is a section taken along line A–A' of FIG. 3.
Figure 5:
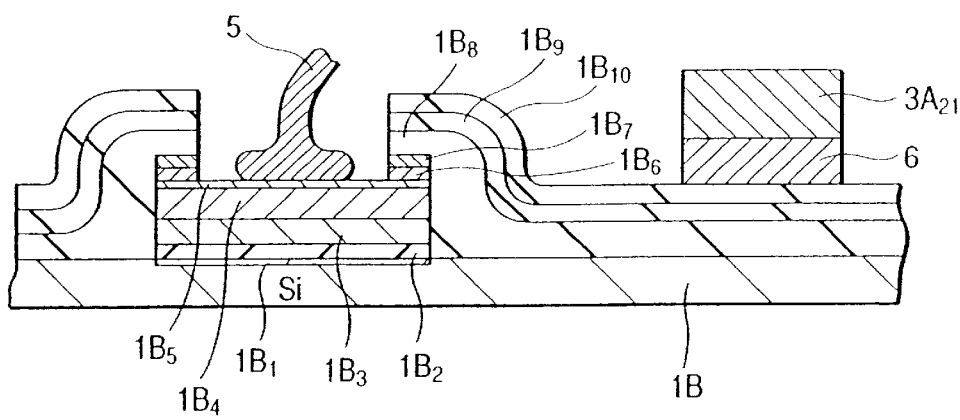
FIG. 5 is an enlarged section view of a part enclosed by a circle M in FIG. 4.

FIG. 3 is a schematic top plan view showing the construction of a resin-sealed type semiconductor device representing an Embodiment 2 of the invention; FIG. 4 is a section taken along line A–A' of FIG. 3; FIG. 5 is an enlarged view of a part enclosed by a circle M in FIG. 4; and FIG. 6 is a section taken along line B–B' of FIG. 3.

In a resin-sealed type semiconductor device representing Embodiment 2, as shown in FIGS. 3 to 6, the portions $3A_{21}$, arranged substantially in parallel with the long sides of the semiconductor chip 1, of the bus-bar leads $3A_2$, are fixed directly with adhesive 6. The plurality of signal line inner leads $3A_1$ are lifted at their leading ends $3A_{11}$ from the chip major face, and no insulating film is interposed to provide spacings (distance of 0.05 mm) S between the major face of the semiconductor chip 1 and the thinned portions $3A_{12}$ of the plurality of signal line inner leads $3A_1$. The adhesive 6 employed is, e.g., a thermoplastic polyimide adhesive. This adhesive 6 has a thickness of about 0.01 mm after being applied.

As shown in FIG. 4, the plurality of signal inner leads $3A_1$ are electrically connected to the semiconductor chip 1 by bonding the bonding wires (gold wires) 5 directly to the bonding pads 1A on the major face of the semiconductor chip 1. Specifically, the semiconductor chip 1 and the signal line inner leads 3A, are electrically connected by pressing the lifted thin portions $A_{12}$ of the signal line inner leads $3A_1$ to the major face of the semiconductor chip 1 by a lead frame presser to bond the bonding wires 5 to the leading end portions $3A_{11}$ and by bonding the other ends of the bonding wires 5 to the bonding pads 1A on the major face of the semiconductor chip 1.

Figure 6:
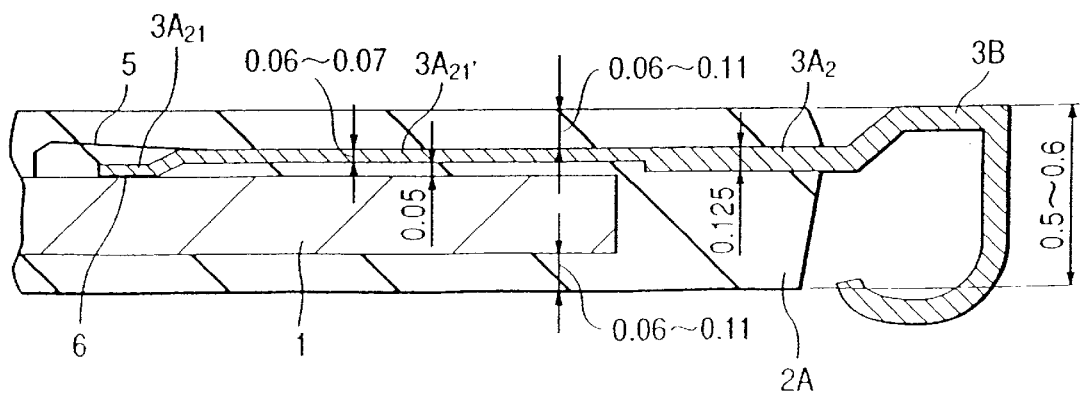
FIG. 6 is a section taken along line B14 B' of FIG. 3.

Likewise, as shown in FIG. 6, the protrusions $3A_{22}$ and the joints $3A_{21}'$ of the bus-bar leads $3A_2$ and the bonding pads 1A on the major face of the semiconductor chip 1 are individually bonded by the bonding wires 5 to connect the semiconductor chip 1 and the bus-bar leads $3A_2$ electrically. After this, they are sealed with the sealer (resin) 2A.

The bonding pads 1A on the major face of the semiconductor chip 1 have a structure, as seen in FIG. 5, in which an insulating oxide film $1B_2$ is formed on an inner electrode $1B_1$ on an Si substrate 1B and in which there are sequentially formed thereover a first tungsten (W) alloy $1B_3$, a second tungsten (W) alloy $1B_4$, an aluminum (Al) alloy $1B_5$, a first titanium (Ti) alloy $1B_6$, a second titanium (Ti) alloy $1B_7$, a first insulating oxide film $1B_8$, a second insulating film $1B_9$ and a resin PiQ $1B_{10}$. Moreover, a hole is formed to expose the face of the aluminum (Al) alloy $1B_5$ to the outside.

Even if the inner lead portions 3A are fixed to the major face of the semiconductor chip 1 directly with the adhesive 6, the insulating polyimide resin (PiQ) is formed at the uppermost layer of the major face of the semiconductor chip 1, as shown in FIG. 5, so that the insulation of the portions other than the inner lead portions 3A and the bonding pads 1A of the semiconductor chip 1 can be ensured.

The assembling steps for arranging the inner lead portions 3A over the major face of the semiconductor chip 1 of the resin-sealed type semiconductor device of Embodiment 2 will be described.

Assembling Steps:

①: Preparing a flat frame having a plurality of leads 3;

②: Applying adhesive 6 to the two bus-bar leads $3A_2$, and shaping the lead frame to form the steps D (Here, the adhesive 6 may be applied after the step formation);

③: Over the semiconductor chip 1, positioning the lead frame in such a way that the plurality of signal line inner leads $3A_1$ may extend across the individual long sides of the rectangle of the semiconductor chip 1 and to the center region of the semiconductor chip 1 (see FIG. 3); and ④: After this positioning, bonding the chip and the lead frame with the adhesive 6.

Figure 7A:
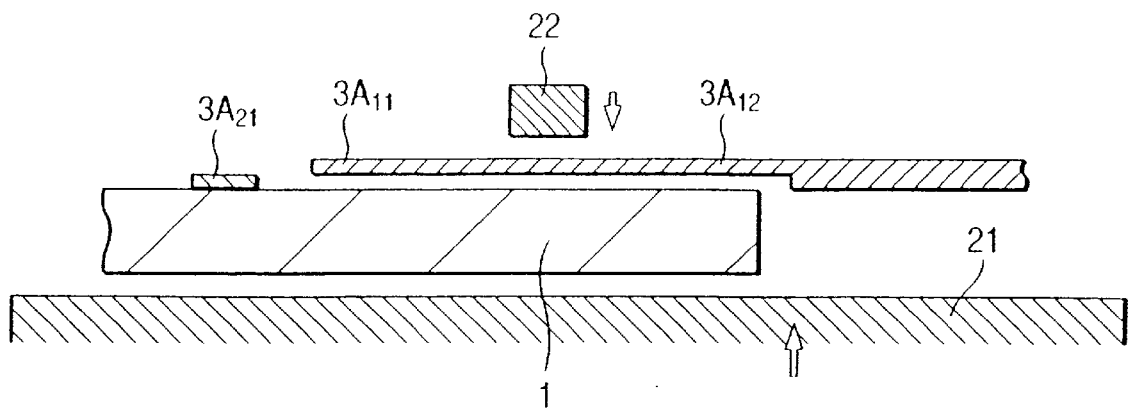
FIGS. 7(a) to 7(c) are diagrams for explaining a method of bonding wires to signal line inner leads.
Figure 7B:
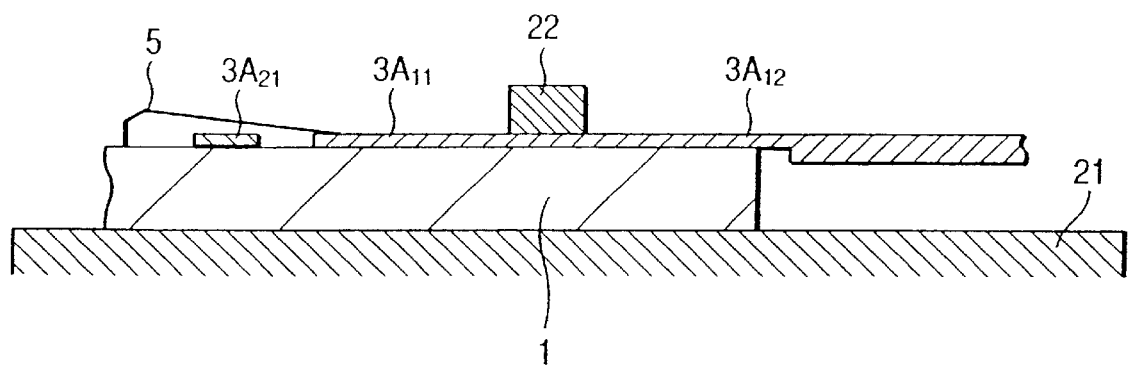
Figure 7C:
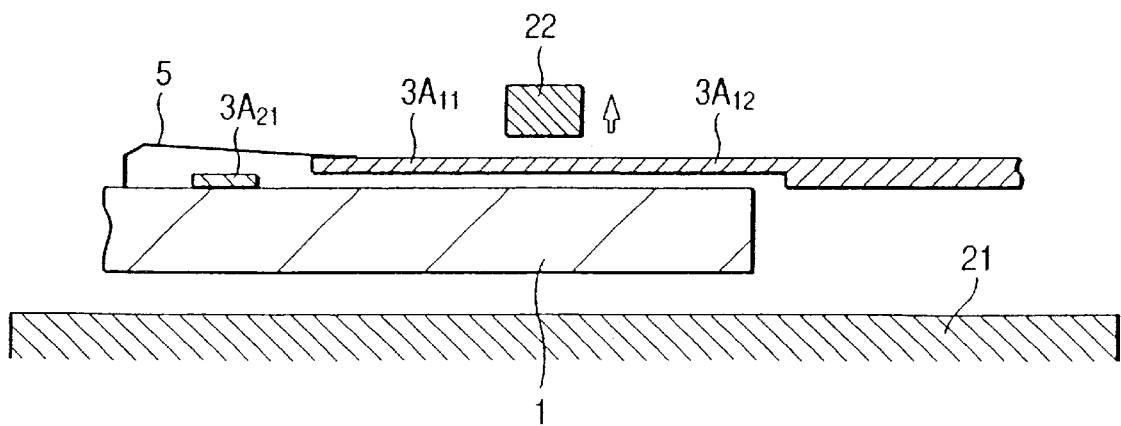

FIGS. 7(a) to 7(c) are diagrams for explaining a method for bonding the bonding wires 5 to the signal line inner leads. FIG. 7(a) shows the state before the wire bonding; FIG. 7(b) shows the state during the wire bonding; and FIG. 7(c) shows the state after the wire bonding. Numeral 21 designates a stage, and numeral 22 designates a lead frame presser.

In a method of bonding the bonding wires 5 by pressing the listed leading end portion $3A_{11}$ of the signal line inner lead $3A_1$ to the major face of the semiconductor chip 1, as shown in FIG. 7(a), the semiconductor chip 1 is disposed over the stage 21 to position the lifted leading end portion $3A_{11}$ of the signal line inner lead $3A_1$. Next, as shown in FIG. 7(b), after the positioning of the inner lead, the lead frame presser 22 is lowered, but the stage 21 is raised to bond the bonding wire 5 to the leading end portion $3A_{11}$ while pressing the signal line inner lead $3A_1$ to the major face of the semiconductor chip 1 over the stage 21. After this, as shown in FIG. 7(c), the lead frame presser 22 is raised, and the stage 21 is lowered to release the pressing force, thereby to return the leading end portion $3A_{11}$ of the signal line inner lead $3A_1$ to the lifted state.

Figure 8A:
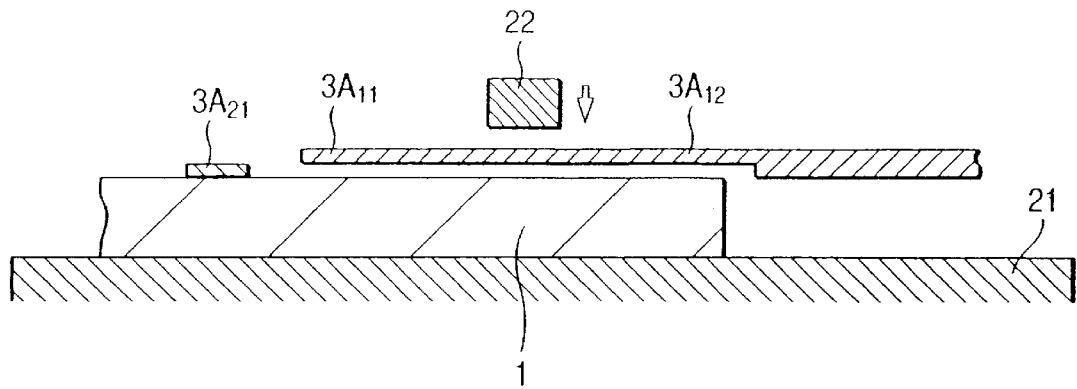
FIGS. 8(a) to 8(c) are diagrams for explaining another method of bonding wires to signal line inner leads.
Figure 8B:
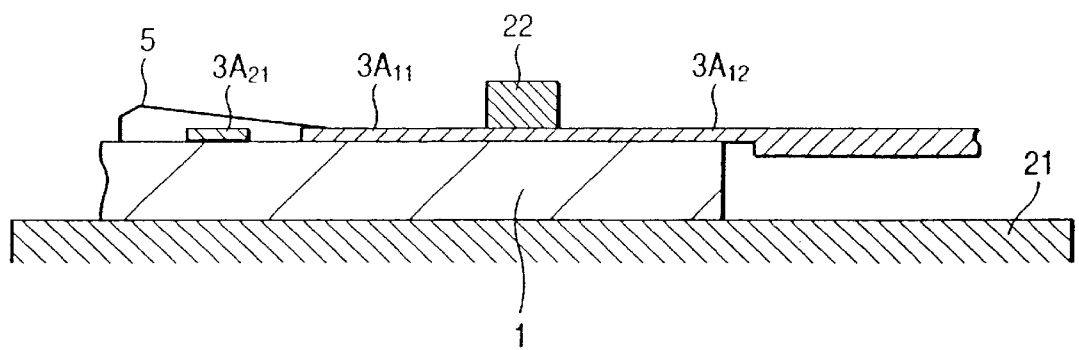
Figure 8C:
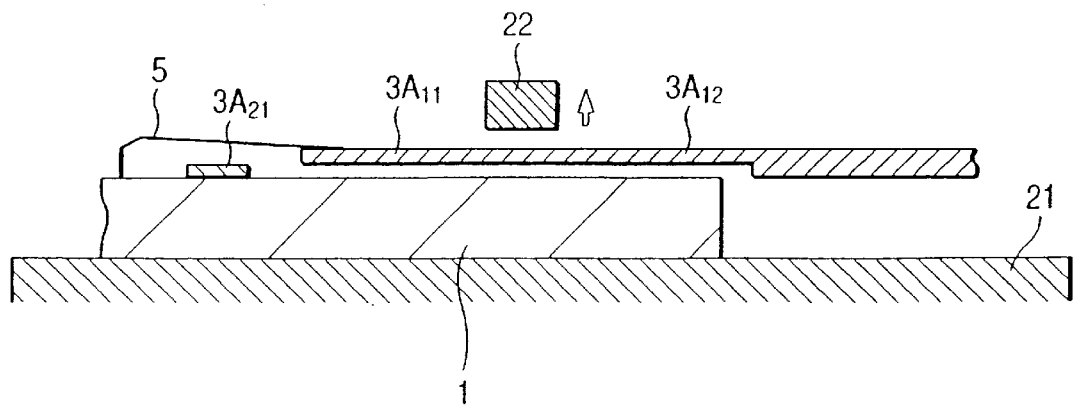

FIGS. 8(a) to 8(c) are diagrams for explaining another method for bonding the bonding wire 5 to the signal line inner lead. FIG. 8(a) shows the state before the wire bonding; FIG. 8(b) shows the state during the wire bonding; and FIG. 8(c) shows the state after the wire bonding. In the method of bonding the bonding wire 5 to the signal line inner lead, as shown in FIG. 8(a), the semiconductor chip 1 is disposed over a fixed stage 21 to position the lifted leading end portion $3A_{11}$ of the signal line inner lead $3A_1$. Next, as shown in FIG. 8(b), after the positioning of the inner lead, the lead frame presser 22 is lowered to bond the bonding wire 5 to the leading end portion $3A_{11}$ while pressing the signal line inner lead $3A_1$ on the major face of the semiconductor chip 1 over the stage 21. After this, as shown in FIG. 8(c), the lead frame presser 22 is raised to release the pressing force, thereby to return the leading end portion $3A_{11}$ of the signal line inner lead $3A_1$ to the lifted state.

In Embodiment 2, the portions $3A_{21}$, arranged substantially in parallel with the long sides of the semiconductor chip 1, of the bus-bar leads $3A_2$ are fixed directly with the adhesive 6 in such a way that the plurality of signal line inner leads $3A_1$ are lifted at their leading ends, no insulating film is interposed and the spacings (the distances are 0.05 mm) S are provided between the major face of the semiconductor chip 1 and the plurality of signal line inner leads $3A_1$. As a result, the parasitic capacitance can be reduced to achieve effects similar to those of Embodiment 1. Moreover, the insulating film 4 (having a thickness of 0.05 mm) is not interposed between the major face of the semiconductor chip 1 and the inner lead portions 3A, so that the steps of manufacture and the cost can be accordingly reduced.

Embodiment 3

Figure 9:
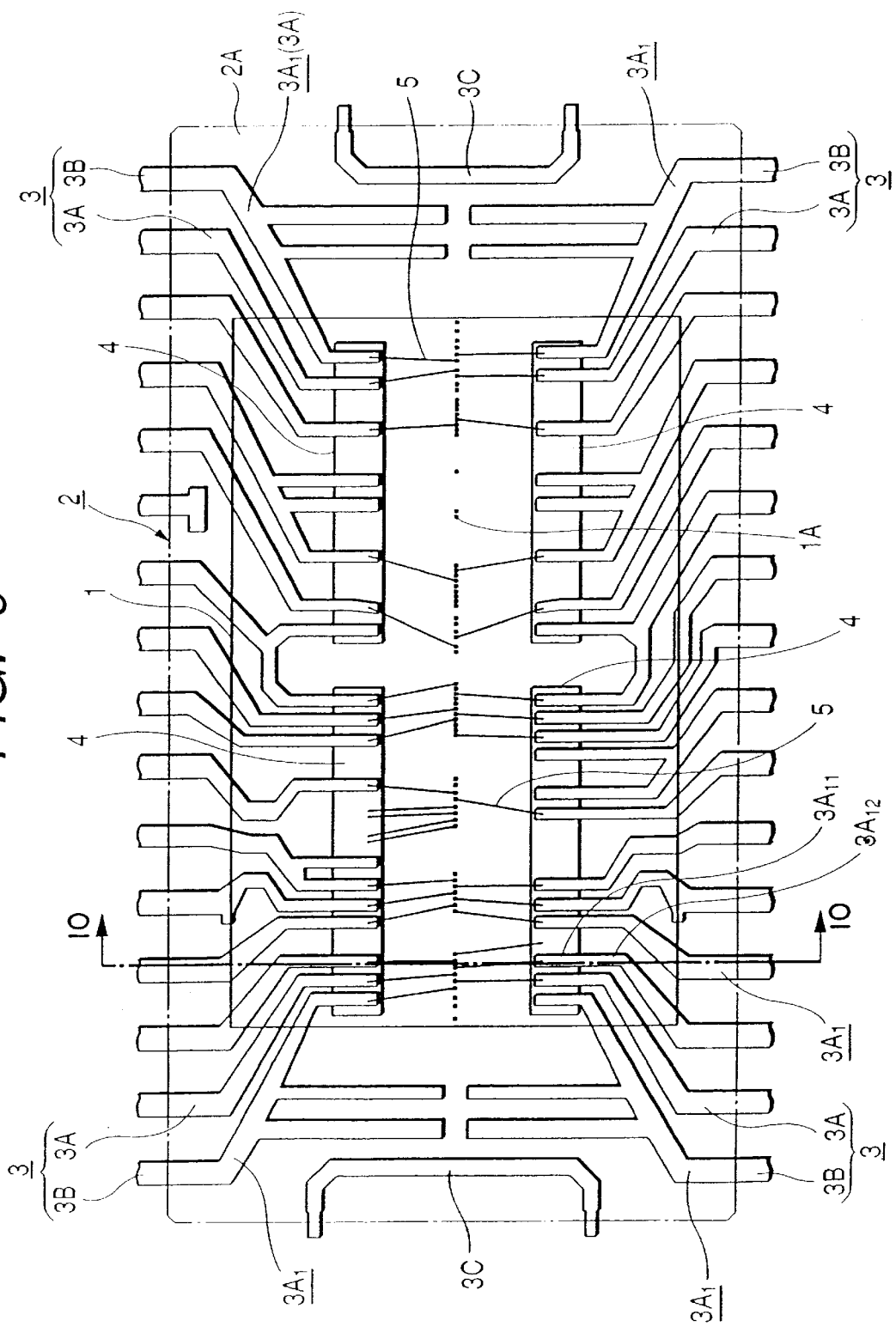
FIG. 9 is a schematic top plan view showing the construction of a resin-sealed type semiconductor device of Embodiment 3 of the invention.
Figure 10:
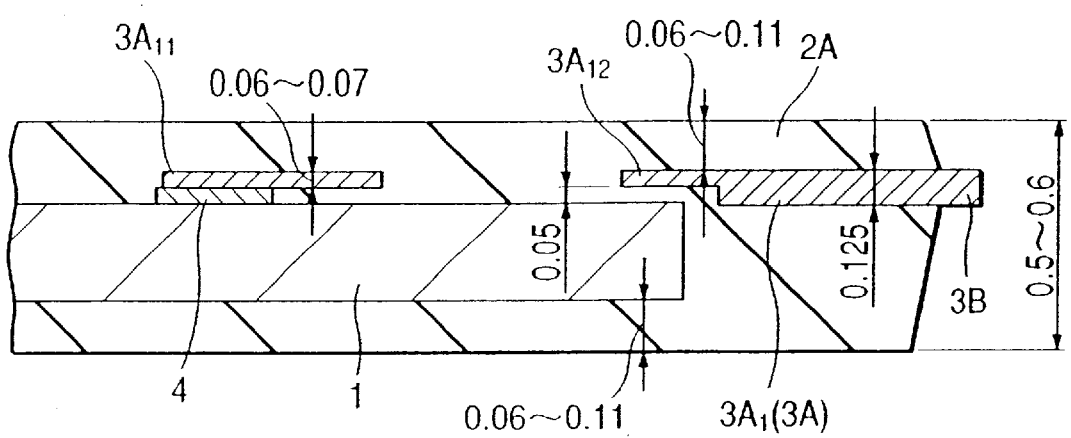
FIG. 10 is a section taken along line A–A' in FIG. 9.

FIG. 9 is a schematic top plan view showing the construction of a resin-sealed type semiconductor device representing Embodiment 3 of the invention, and FIG. 10 is a section taken along line A–A' of FIG. 9.

In the resin-sealed type semiconductor device of Embodiment 3, as shown in FIGS. 9 and 10, the invention is applied to the case in which the portions $3A_{21}$ arranged substantially in parallel with the long sides of the semiconductor chip 1, of the bus-bar leads $3A_2$ of the inner lead portions 3A of Embodiment 1, are not used. The structure of the other portions is identical to that of Embodiment 1.

The assembling steps for arranging the inner lead portions 3A over the lead portions 3A over the major face of the aforementioned semiconductor chip 1 will be described.

Assembling Steps:

①: Preparing a flat frame having the insulating film 4;

②: Over the semiconductor chip 1, positioning the lead frame in such a way that the plurality of signal line inner leads $3A_1$ may extend to the center region of the semiconductor chip 1 (see FIGS. 9 and 10); and ③: After this positioning, bonding the lead frame to the major face of the semiconductor chip 1 through the insulating film 4.

With this construction, it is possible to achieve effects similar to those of Embodiment 1. Since the bus-bar leads $3A_2$ are not employed, moreover, the steps of manufacture and the cost can be accordingly reduced.

Embodiment 4

Figure 12:
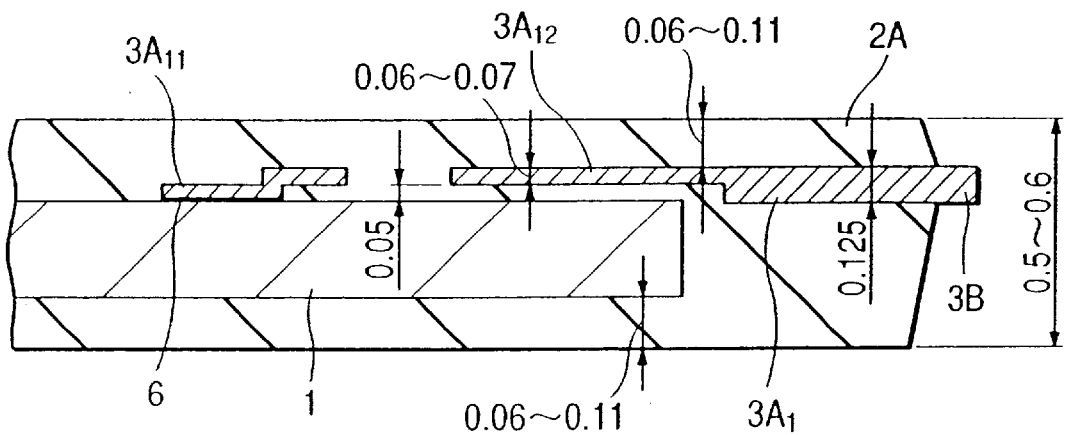
FIG. 12 is a section taken along line A–A' in FIG. 11.
Figure 11:
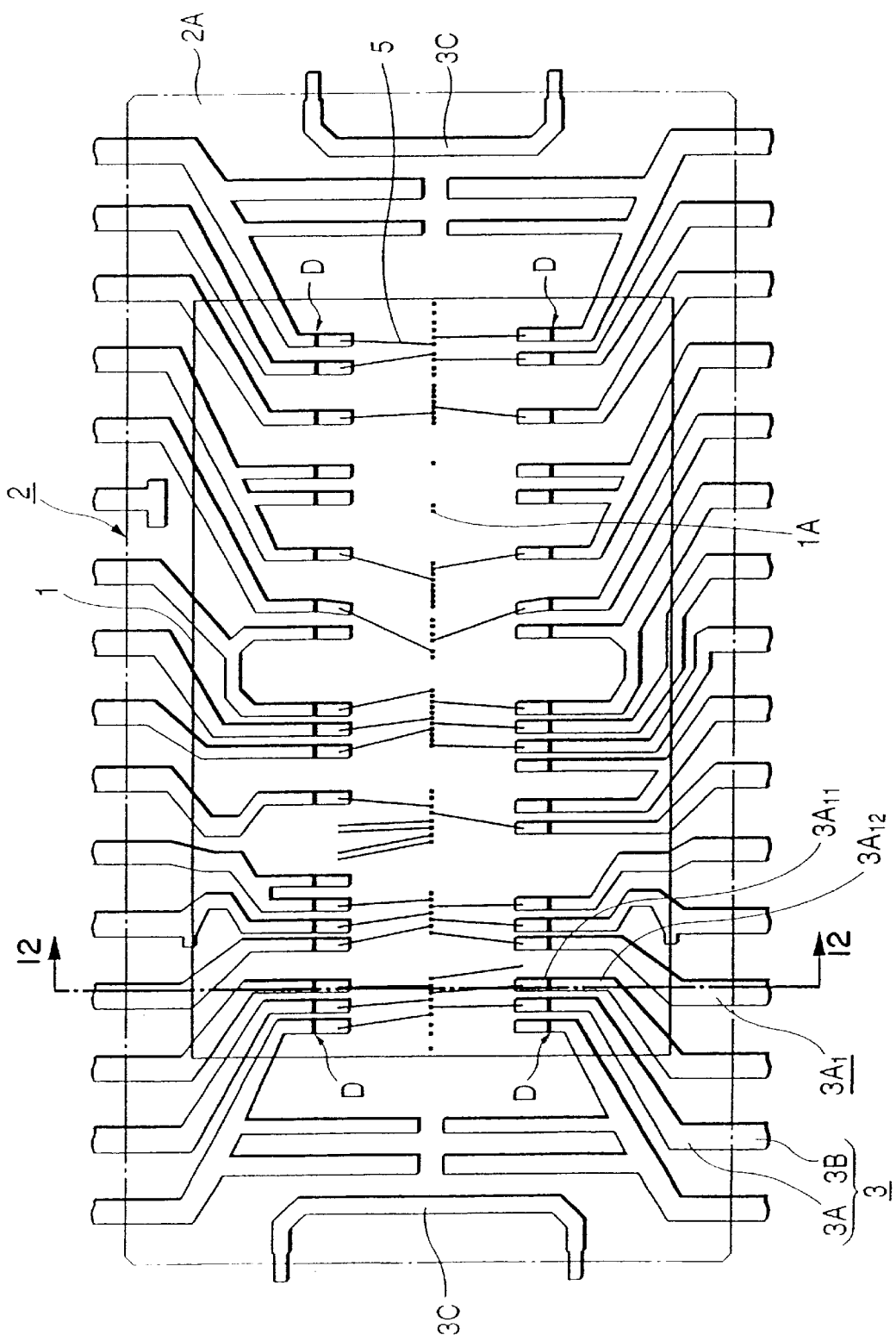
FIG. 11 is a schematic top plan view showing the construction of a resin-sealed type semiconductor device of Embodiment 4 of the invention.

FIG. 11 is a schematic top plan view showing the construction of a resin-sealed type semiconductor device representing Embodiment 4 of the invention, and FIG. 12 is a section taken along line A–A' of FIG. 11.

In the resin-sealed type semiconductor device of Embodiment 4, as shown in FIGS. 11 and 12, the leading ends $3A_{11}$ of the plurality of signal line inner leads $3A_1$ of Embodiment 3 are fixed to the major face of the semiconductor chip 1 directly with the adhesive 6, and no insulating film 4 is interposed. The spacings (the distances are 0.05 mm) for reducing the parasitic capacitance are provided between the major face of the semiconductor chip 1 and the plurality of signal line inner leads $3A_{12}$.

The assembling steps for arranging the inner lead portions 3A over the major face of the aforementioned semiconductor chip 1 of the resin-sealed type semiconductor device of Embodiment 4 will be described.

Assembling Steps:

①: Preparing a frame which is configured to form a step and of which the leading ends $3A_{11}$ of the inner lead portions 3A are coated with the adhesive 6.

②: Over the semiconductor chip 1, positioning the lead frame in such a way that the plurality of signal line inner leads $3A_1$ may extend to the center region of the semiconductor chip 1 (see FIGS. 11 and 12); and ③: After this positioning, bonding the major face of the semiconductor chip 1 and the lead frame through the adhesive 6.

With this construction, it is possible to achieve effects similar to those of Embodiment 3. Since the bus-bar leads $3A_2$ and the insulating film 4 are not employed, moreover, the steps of manufacture and the cost can be accordingly reduced.

Embodiment 5

Figure 13:
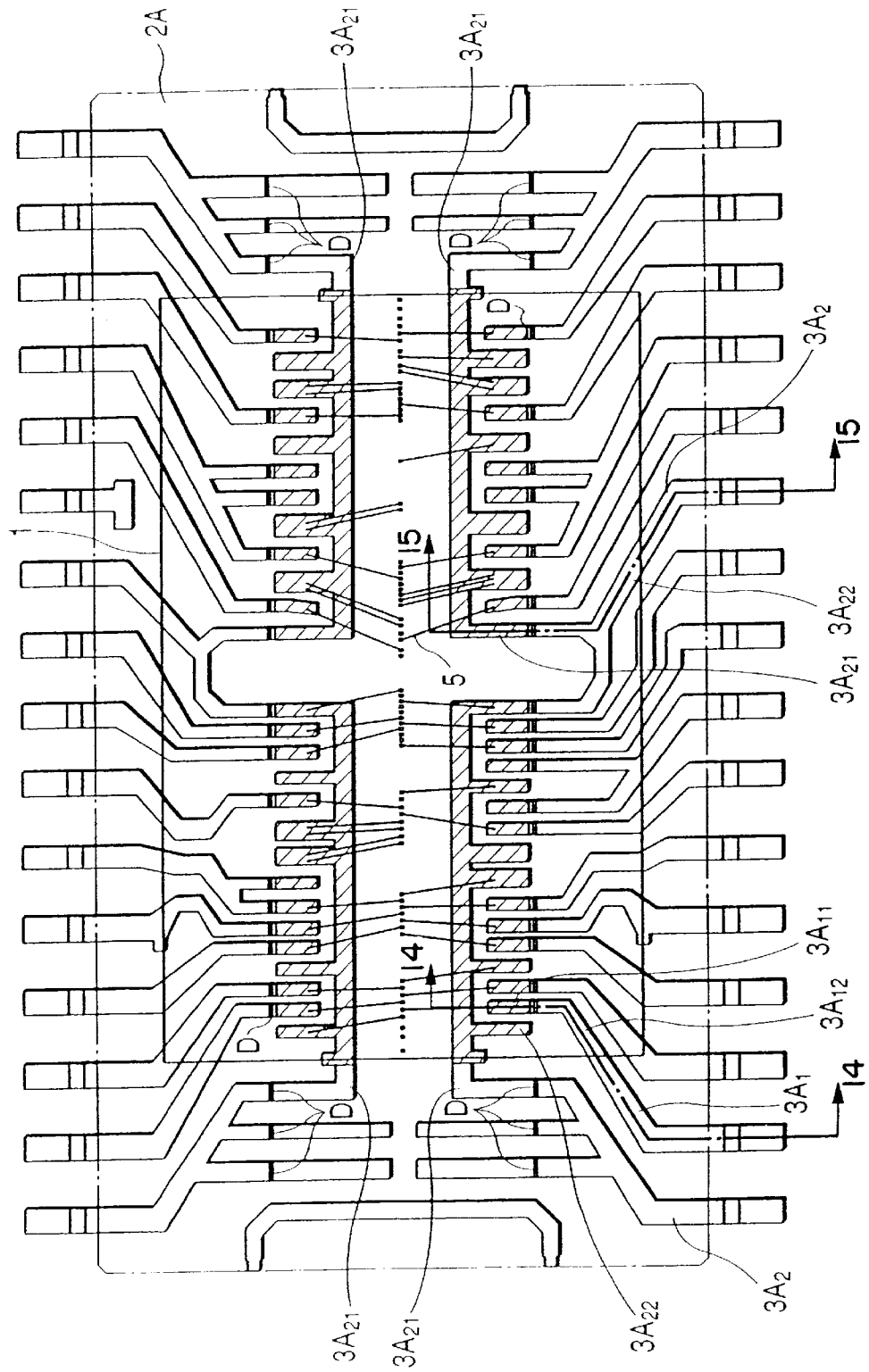
FIG. 13 is a schematic top plan view showing a construction of a resin-sealed type semiconductor device of Embodiment 5 of the invention.
Figure 14:
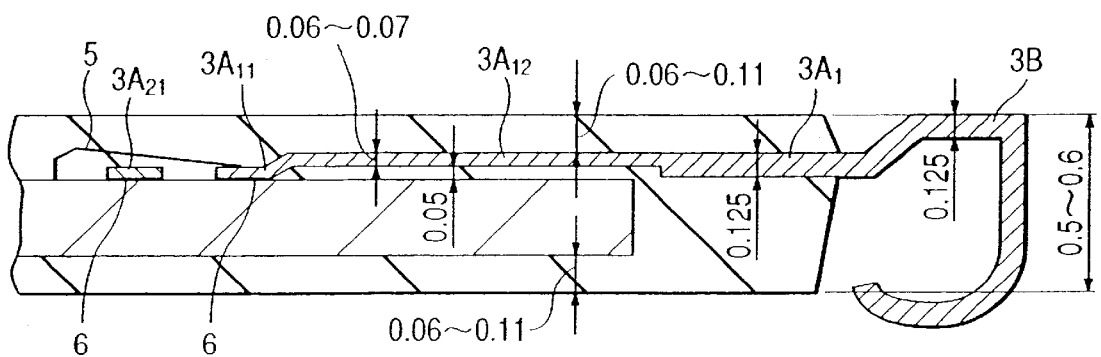
FIG. 14 is a section taken along line A–A' of FIG. 13.
Figure 15:
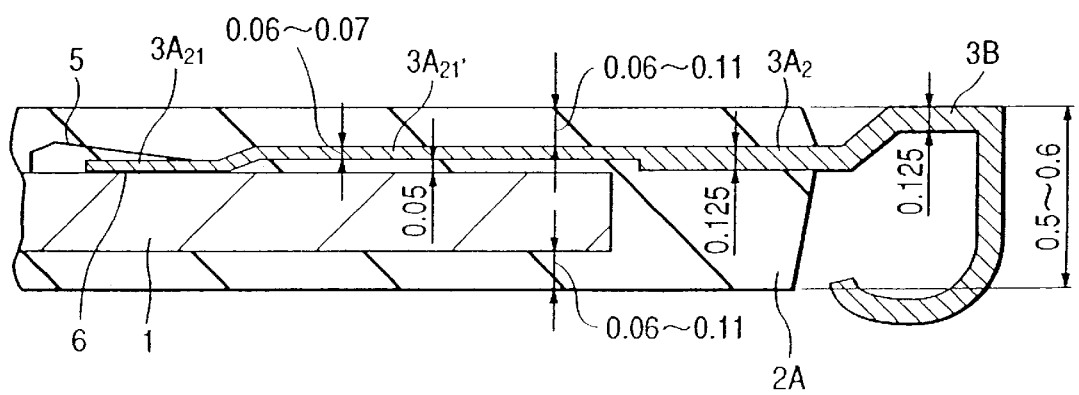
FIG. 15 is a section taken along line B–B' of FIG. 13.

FIG. 13 is a schematic top plan view showing a construction of a resin-sealed type semiconductor device representing Embodiment 5 of the invention; FIG. 14 is a section taken along line A–A' of FIG. 13; and FIG. 15 is a section taken along line B–B' of FIG. 14.

In the resin-sealed type semiconductor device of Embodiment 5, as shown in FIGS. 13 and 14, the portions $3A_{21}$, arranged substantially in parallel with the major face of the semiconductor chip 1, of the bus-bar leads $3A_2$, are fixed directly with the adhesive 6. The individual leading ends of the plurality of signal line inner leads $3A_1$ are fixed to the major face of the semiconductor chip 1 directly with the adhesive 6, and the spacings (the distances are 0.05 mm) for ensuring the proper capacitance are provided without any insulating film between the major face of the semiconductor chip 1 and the plurality of signal line inner leads $3A_1$.

The assembling steps for arranging the inner lead portions 3A over the major face of the semiconductor chip 1 of the resin-sealed type semiconductor device of Embodiment 5 will be described.

Assembling Steps:

①: Preparing a flat frame and shaping the frame to form steps D;

②: Applying adhesive to the portions $3A_{21}$, arranged substantially in parallel with the long sides of the semiconductor chip 1, of the bus-bar leads $3A_2$, the projections $A_{22}$, and the leading end portions $3A_{12}$ of the plurality of signal line inner leads $3A_1$;

③: Over the semiconductor chip 1 of the lead frame, positioning the portions $3A_{21}$, arranged substantially in parallel with the long sides of the semiconductor chip 1, of the bus-bar leads $3A_2$ in such a way that the leading end portions $3A_{11}$ of the plurality of signal line inner leads $3A_1$ may extend to the center region of the semiconductor chip 1 (as shown in FIG. 15); and ④: After this positioning, bonding the lead frame to the major face of the semiconductor chip 1 with the adhesive 6 (see FIGS. 14 and 15).

After this bonding, the semiconductor chip 1 and the signal line inner leads $3A_1$ are electrically connected by bonding the one ends of the bonding wires 5 to the leading end portions $3A_{11}$ of the inner leads $3A_{12}$ and by bonding the other ends of the bonding wires 5 to the bonding pads 1A on the major face of the semiconductor chip 1. Likewise, the semiconductor chip 1 and the bus-bar leads $3A_2$ are electrically connected by connecting the portions $3A_{22}$ integrated with the portions $3A_{21}$ arranged substantially in parallel with the long sides of the semiconductor chip 1, and the bonding pads 1A on the major face of the semiconductor chip 1 through the bonding wires 5. After this, they are sealed with the resin 2A by a transfer mold method.

With this construction, it is possible to achieve effects similar to those of Embodiment 1. Since the insulating film 4 is not used, moreover, it is possible to reduce the steps of manufacture and the cost. Since the leading end portions $3A_{11}$ of the signal inner leads $3A_1$ are arranged closer to the chip major face, moreover, it is possible to lower the levels of the wire loops.

Figure 16:
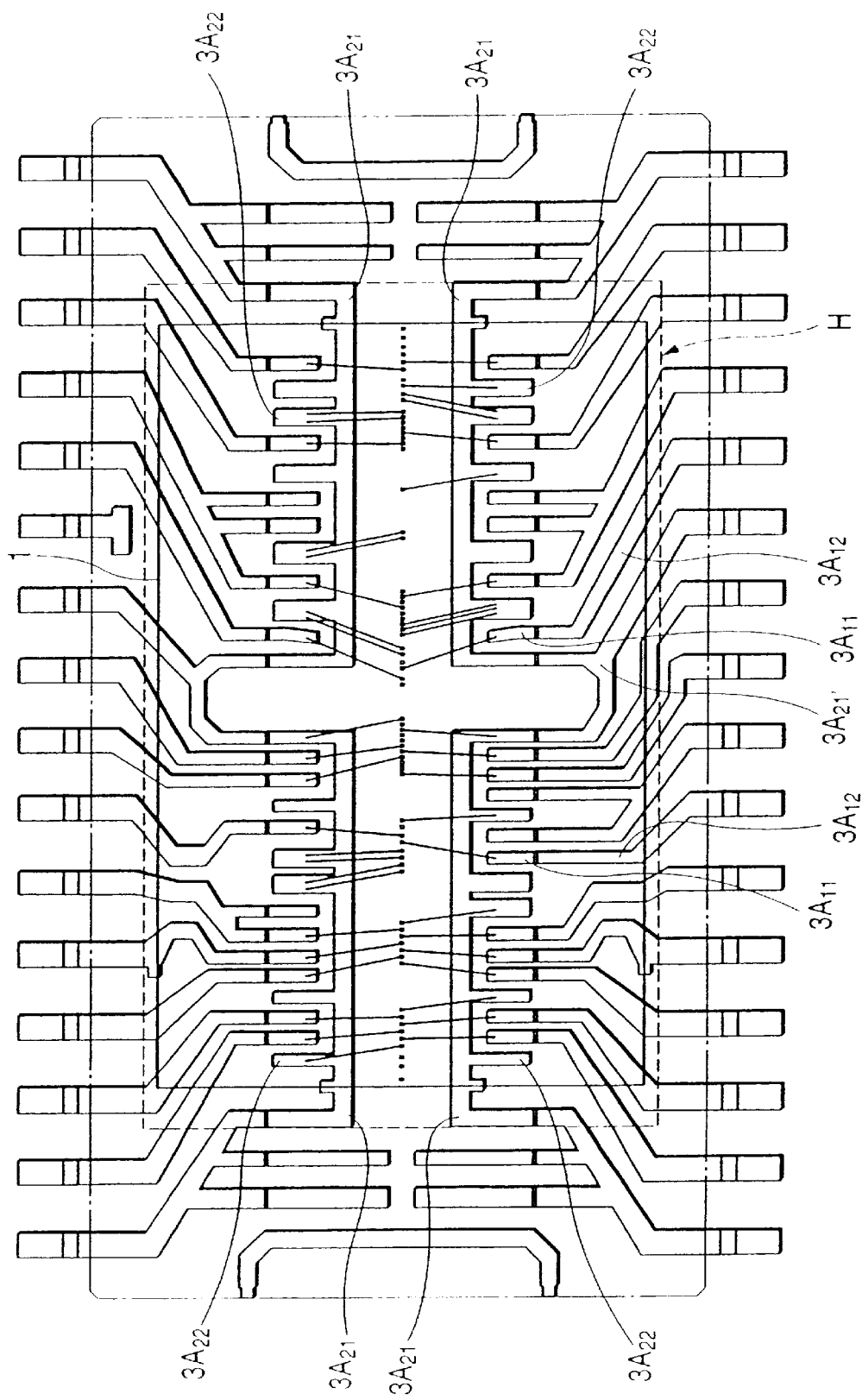
FIG. 16 is a diagram showing a region H where the back faces of the inner lead portions are half-etched.

In Embodiments 1 to 5, the thinned portions $3A_{11}$ and $3A_{12}$ of the signal line inner leads $3A_1$ and the thinned portions $3A_{21}$ and $3A_{21}'$ of the bus-bar leads $3A_2$ are formed by half-etching or coining the back faces of the inner lead portions which are provided in the area H (of a slightly larger rectangular shape than the chip) enclosed by a broken line in FIG. 16.

Figure 17A:
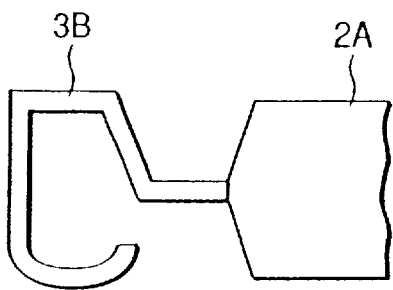
FIGS. 17(a) to 17(d) are diagrams showing various shapes of one of the external leads (outer leads)
Figure 17B:
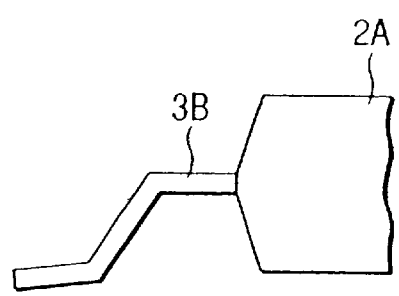
Figure 17C:
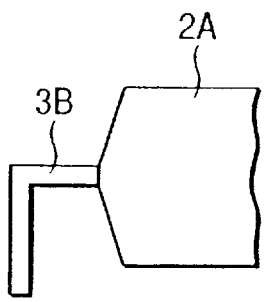
Figure 17D:
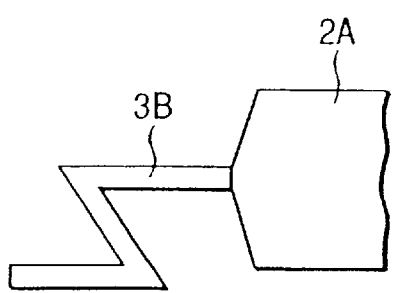

The external leads (outer leads) are worked into a J-bend (letter J) shape, as shown in FIG. 17(a), and are worked, if necessary, into a flat shape, as shown in FIG. 17(b), an inverted L shape, as shown in FIG. 17(c), or a Z shape, as shown in FIG. 17(d).

Here, the structure of the foregoing Embodiments having one semiconductor chip 1 of one layer have been described, but the thin resin-sealed type semiconductor device of the invention can also be applied to the case in which two or more semiconductor chips or semiconductor packages are stacked to increase the storage capacity.

Embodiment 6

Figure 18:
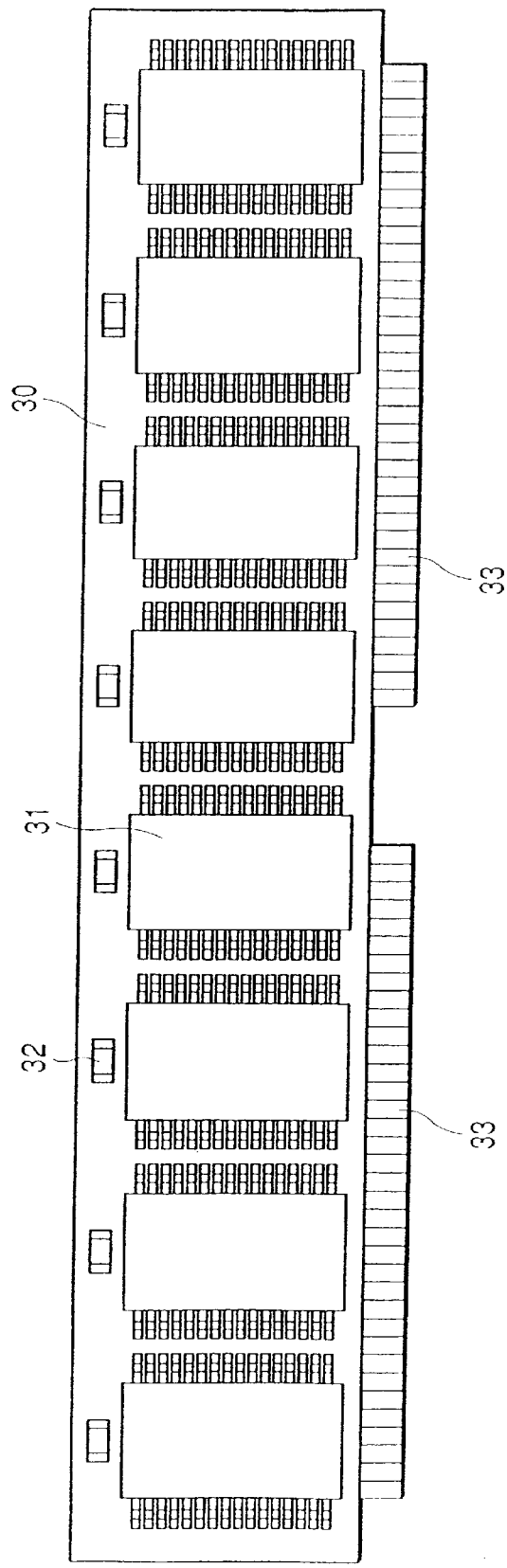
FIG. 18 is a schematic top plan view showing the construction of a module of a semiconductor storage device of Embodiment 6 of the invention.
Figure 19:
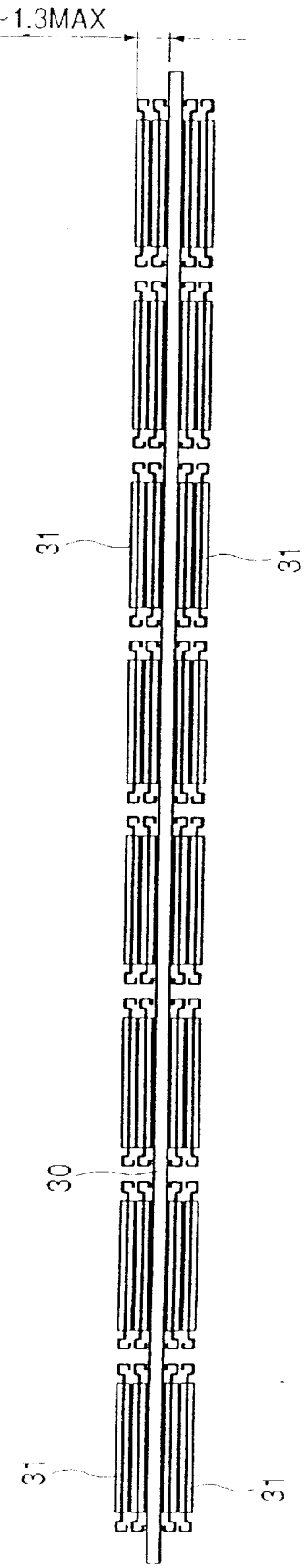
FIG. 19 is a side elevation of the module of FIG. 18.

FIG. 18 is a schematic top plan view showing a construction of a semiconductor storage module representing Embodiment 6 of the invention, and FIG. 19 is a side elevation of FIG. 18. Reference numeral 30 designates a mounting board; numeral 31 denotes a stack in which two semiconductor storage devices,such as DRAMs,are stacked; numeral 32 denotes a chip capacitor; and numeral 33 denotes the terminals of the semiconductor storage module. Any of the packages of Embodiments 1 to 5 can be applied to the individual packages constituting the stack 31.

In the semiconductor storage module of Embodiment 6, as shown in FIGS. 18 and 19, eight stacks 31, in which two semiconductor storage devices,such as DRAMs, are individually stacked, are mounted on both sides of the board 30.

The chip capacitors 32 are mounted on one peripheral portion of the plane of the mounting board 30, and the terminals 33 of the semiconductor storage module are mounted on one edge face of the mounting board 30. With this construction, it is possible to provide a small-sized large-capacity thin semiconductor storage module. The thicknesses of the stacks 31 are about 1.2 to 1.3 mm at the maximum.

Embodiment 7

Figure 20B:
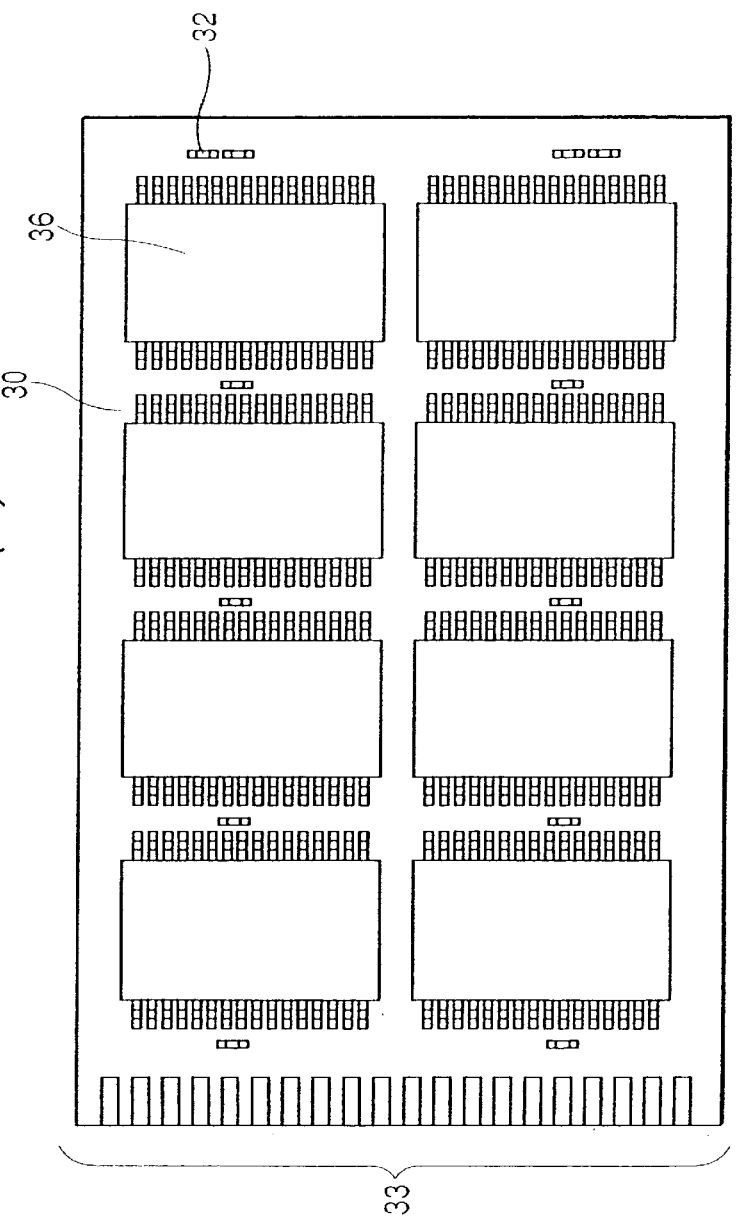
Figure 21:
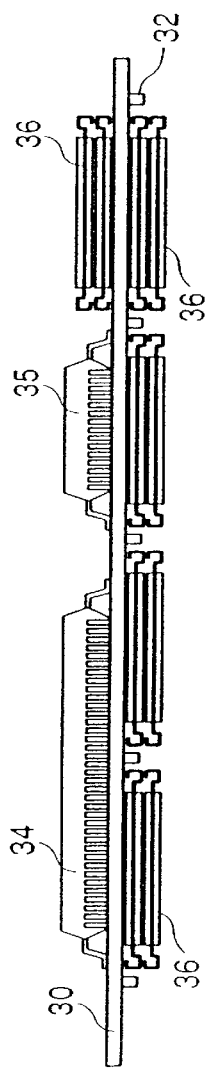
FIG. 21 is a side elevation, of the device of FIGS. 20(a) and 20(b)
Figure 22:
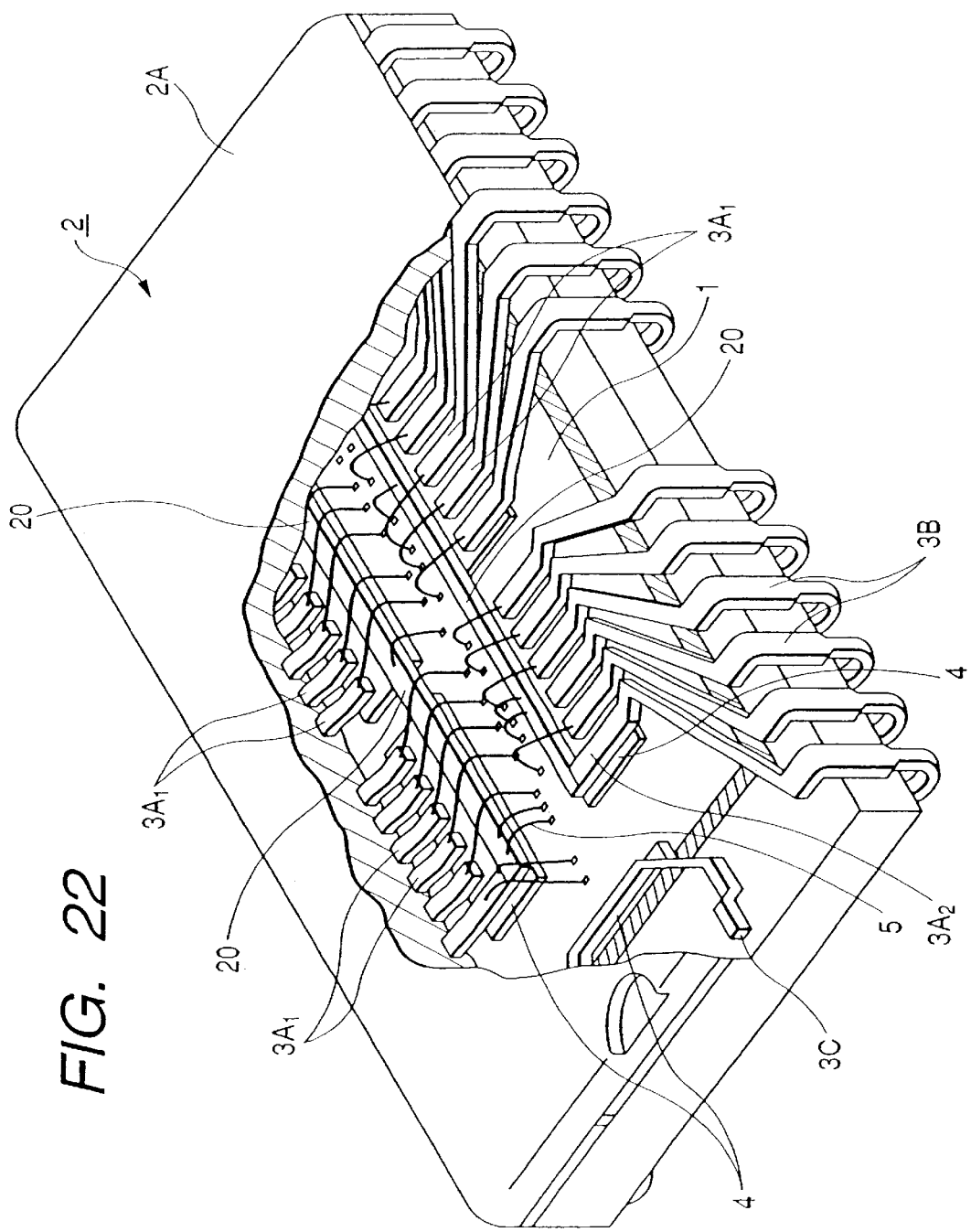
FIG. 22 is a partially cut-away schematic perspective view showing the entire construction of a conventional resin-sealed type semiconductor device having an LOC structure.
Figure 23:
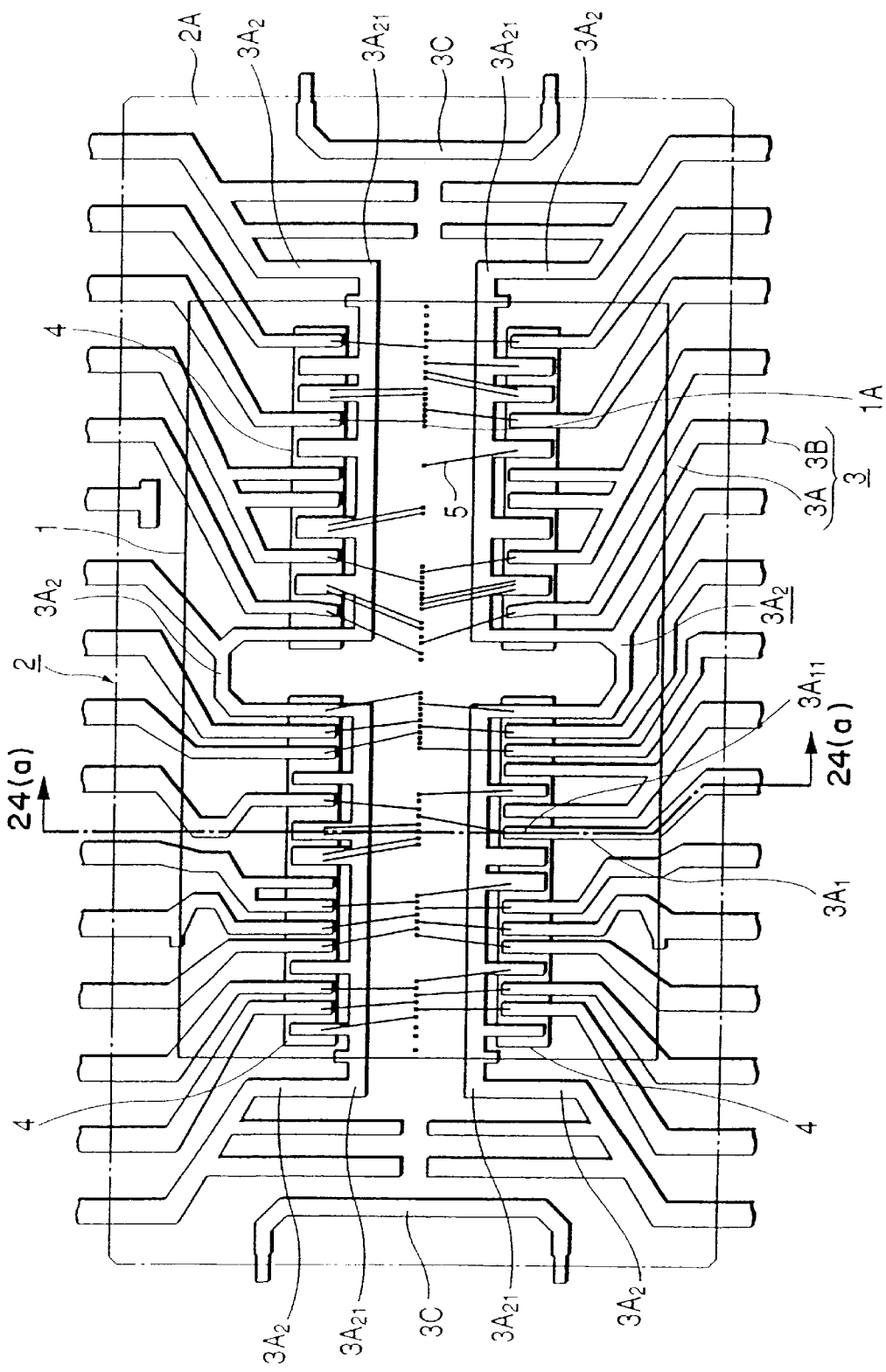
FIG. 23 is a schematic top plan view showing a construction of a resin-sealed type semiconductor device having a TSOP structure, which has been investigated by us.

FIGS. 20(a), 20(b) and 21 show the construction of an electronic device representing Embodiment 7 of the invention. FIG. 20(a) is a top plan view of one face, FIG. 20(b) is a top plan view of the other face, and FIG. 21 is a side elevation of the device. In FIGS. 20(a), 20(b) and 21, numeral 34 designates a QFP in which a microcomputer is mounted; numeral 35 denotes a QFP in which a driver IC is mounted; and numeral 36 denotes a stack in which two semiconductor storage devices,such as flash memories are stacked. Any of the packages of Embodiments 1 to 5 may be applied to tho individual packages constituting the stack 36.

In the semiconductor storage module of Embodiment 7, ac shown in FIGS. 20(a), 20(b) and 21, there are mounted on one face (front face) of the board 30, three stacks 36 of semiconductor storage devices,such as flash memories, a microcomputer (QFP) 34, a driver (QFP) 35 and chip capacitors 32, and there are mounted on the other face (back face) eight stacks 36 in each of which two semiconductor storage devices, such as flash memories,are stacked, and chip capacitors 32. with this construction, it is possible to provide an electronic device of a small size having a large storage capacity. As a result, it is possible to provide an electronic card capable of processing massive amounts of information with high accuracy. The thicknesses of the stacks 36 are 1.2 to 1.3 mm at the maximum, which are substantially equal to those of the QFPs 34 and 35.

Although our invention has been specifically described in conjunction with various embodiments, it should not be limited thereto,but can naturally be modified in various manners without departing from the gist thereof.

The effects of representative features of the invention disclosed herein will be briefly described in the following.

(1) In a resin-sealed type semiconductor device having bus-bar leads, the signal inner leads (the first regions of the inner lead portions) are so arranged over the major face of the semiconductor chip as to provide predetermined spacings between the major face and the inner leads, and portions of the inner leads are made thinner than those of the other portions. As a result, even if no insulating coating material is applied to the bus-bar leads, the thickness of the semiconductor package can be reduced without causing any short-circuit between the signal line bonding wires and the bus-bar leads.

(2) In a Lesin-sealed type semiconductor device having bus-bar leads, even if the semiconductor package is thinned, a proper capacitance can be ensured by sandwiching the insulating film between the major face of the semiconductor chip and the inner lead portions to provide predetermined spacings. As a result, the required electric characteristics can be achieved by the proper capacitance of the resin-sealed type semiconductor device.

(3) In a resin-sealed type semiconductor device having bus-bar leads even if the semiconductor package is thinned, it is possible to ensure a proper thickness for the sealer over the major face of the semiconductor chip of the semiconductor package.

(4) In a resin-sealed type semiconductor device having bus-bar leads, even if the semiconductor package is thinned, the upper and lower sealers of the semiconductor chip can be balanced by bringing the projections of the outer leads closer to the central portion in the direction of the thickness of the semiconductor package. As a result, it is possible to prevent warpage which might otherwise be caused by the difference in the coefficients of thermal expansion of the semiconductor package.

(5) In a resin-sealed type semiconductor device having bus-bar leads, the signal inner leads (the first regions of the inner lead portions) are so arranged over the major face of the semiconductor chip as to provide predetermined spacings between the major face and the inner leads, and only the bus-bar leads are directly fixed to the major face of the semiconductor chip with adhesive. As a result, the steps of manufacture and the cost can be reduced correspondingly to the elimination of the insulating film.

(6) In a resin-sealed type semiconductor device not having bus-bar leads, the signal inner leads are so arranged over the major face of the semiconductor chip as to provide predetermined spacings between the major face and the inner leads, and the portions of the inner leads are made thinner than those of the other portions are fixed at their leading end portions to the major face of the semiconductor chip through the insulating film. This ensures the proper insulation between the semiconductor chip and the leads.

(7) In a resin-sealed type semiconductor device not having bus-bar leads, even if the semiconductor package is thinned, a proper capacitance can be ensured by interposing the insulating film between the major face of the semiconductor chip and the inner lead portions to provide predetermined spacings. As a result, the required electric characteristics can be achieved by the proper capacitance of the resin-sealed type semiconductor device. As a result, the steps of manufacture and the cost can be reduced correspondingly to the elimination of the insulating film.

(8) In a resin-sealed type semiconductor device not having bus-bar leads, even if the semiconductor package is thinned, it is possible to ensure a proper thickness for the sealer over the major face of the semiconductor chip of the semiconductor package.

(9) In a resin-seal type semiconductor device not having bus-bar leads, predetermined spacings are provided not by interposing the insulating film between the major face of the semiconductor chip and the inner lead portions, and only the leading end portions of the inner lead portions are fixed to the major face of the semiconductor chip directly with adhesive. However, the uppermost layer of the major face of the semiconductor chip is an insulating film capable of ensuring the insulation between the semiconductor chip and the leads. As a result, the steps of manufacture and the cost can be reduced correspondingly to the elimination of the bus-bar leads and the insulating film.

What is claimed is:

1. A semiconductor device comprising:
    a semiconductor chip including an integrated circuit and a plurality of external terminals formed at a major surface thereof;
    a plurality of leads each having an inner lead and an outer lead which is formed integrally with said inner lead, each of said inner leads having a first portion which is disposed over said major surface of said semiconductor chip, a second portion which is outside of said semiconductor chip, and a stepped portion between said first and second portions, said plurality of leads having an upper surface and a lower surface which is opposite to said upper surface and is closer to said major surface of said semiconductor chip than said upper surface, said stepped portion being formed at said lower surface such that a thickness of said first portion is thinner than a thickness of said second portion in a thickness direction of said semiconductor chip;

an adhesive layer being formed between said first portion of each of said inner leads and said major surface of said semiconductor chip, said first portion of each of said inner leads and said major surface of said semiconductor chip being bonded to one another by said adhesive layer;

a plurality of bonding wires electrically connecting said inner leads with the corresponding external terminals of said plurality of external terminals; and a resin member sealing said semiconductor chip, said inner leads of said plurality of leads and said plurality of boding wires, wherein a thickness of said adhesive layer is thinner than the degree of thickness change of said inner leads at said stepped portion in said thickness direction of said semiconductor chip.

2. A semiconductor device according to claim 21, wherein said degree of said stepped portion corresponds to a differential of thickness between said first and second portions of said inner lead.

3. A semiconductor device according to claim 2, wherein said lower surface positioned at said second portion of said inner lead is disposed at a lower level than said major surface of said semiconductor chip in said thickness direction of said semiconductor chip.

4. A semiconductor device according to claim 3, wherein said adhesive layer includes a thermoplastic polyimide adhesive.

5. A semiconductor device according to claim 1, wherein said adhesive layer is formed partially between said major surface of said semiconductor chip and said first portion of each of said inner leads, and wherein ends of said bonding wires are contacted with said first portions of said inner leads at which said adhesive layer is formed.

6. A semiconductor device according to claim 1, wherein said plurality of leads include signal leads.

7. A semiconductor device according to claim 1, wherein ends of said first portions of said inner leads are offset toward said major surface of said semiconductor chip, and wherein said adhesive layer is formed between each of said ends of said first portions of said inner leads and said major surface of said semiconductor chip.

8. A semiconductor device according to claim 1, wherein said adhesive layer is an adhesive which does not include a base insulating tape.

* * * * *